United States Patent
Katayama et al.

(10) Patent No.: US 9,508,413 B2
(45) Date of Patent: Nov. 29, 2016

(54) SEMICONDUCTOR STORAGE DEVICE

(71) Applicant: KABUSHIKI KAISHA TOSHIBA, Minato-ku, Tokyo (JP)

(72) Inventors: Akira Katayama, Seoul (KR); Masahiro Takahashi, Seongnam-si (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/958,325

(22) Filed: Dec. 3, 2015

(65) Prior Publication Data
US 2016/0086647 A1 Mar. 24, 2016

Related U.S. Application Data

(63) Continuation of application No. 14/203,458, filed on Mar. 10, 2014, now Pat. No. 9,230,629.

(60) Provisional application No. 61/874,879, filed on Sep. 6, 2013.

(51) Int. Cl.
| | | |
|---|---|---|
| G11C 11/00 | (2006.01) | |
| G11C 5/06 | (2006.01) | |
| G11C 11/16 | (2006.01) | |
| G11C 11/02 | (2006.01) | |
| G11C 5/02 | (2006.01) | |
| G11C 7/00 | (2006.01) | |
| G11C 16/26 | (2006.01) | |
| G11C 13/00 | (2006.01) | |
| G11C 11/56 | (2006.01) | |

(52) U.S. Cl.
CPC ............ *G11C 11/1673* (2013.01); *G11C 11/16* (2013.01); *G11C 11/161* (2013.01); *G11C 11/1659* (2013.01); *G11C 11/1675* (2013.01); *G11C 13/003* (2013.01); *G11C 13/004* (2013.01); *G11C 13/0021* (2013.01);
(Continued)

(58) Field of Classification Search
CPC ..... G11C 11/16; G11C 11/5607; G11C 5/06; G11C 13/004
USPC .............................. 365/63, 158, 171, 173, 66
See application file for complete search history.

(56) References Cited

U.S. PATENT DOCUMENTS 7,263,003 B2 * 8/2007 Edahiro ................... G11C 7/12
257/E21.691
8,081,518 B2 12/2011 Tanaka et al.
(Continued)

FOREIGN PATENT DOCUMENTS

| JP | 2008123641 A | 5/2008 |
|---|---|---|
| JP | 2013206493 A | 10/2013 |
| WO | 2009110537 A1 | 9/2009 |

OTHER PUBLICATIONS

JEDEC Solid State Technology Association/ JEDEC Standard, Low Power Double Data Rate 2 (LPDDR2)(Revision of JESD209-2A, Oct. 2009); pp. 20-29 and pp. 183-185.
(Continued)

*Primary Examiner* — Ly D Pham
(74) *Attorney, Agent, or Firm* — Holtz, Holtz & Volek PC

(57) ABSTRACT

A semiconductor storage device includes a first bit line and a second bit line. A nonvolatile memory element and a first cell transistor are connected in series between the first bit line and the second bit line. A sense transistor has a gate connected to a sense node which is provided between the first bit line and the memory element. A read bit line is connected to a source or a drain of the sense transistor. The read bit line is configured to transmit data of the memory element. A sense amplifier is configured to detect the logic of data transmitted from the read bit line.

6 Claims, 20 Drawing Sheets

(52) U.S. Cl.
CPC ....... *G11C13/0026* (2013.01); *G11C 13/0069* (2013.01); *G11C 5/06* (2013.01); *G11C 11/5607* (2013.01); *G11C 2013/0071* (2013.01); *G11C 2013/0073* (2013.01); *G11C 2213/74* (2013.01); *G11C 2213/79* (2013.01)

(56) References Cited

U.S. PATENT DOCUMENTS

| | | | |
|---|---|---|---|
| 8,614,925 B2* | 12/2013 | Park | G11C 29/785 365/200 |
| 2004/0125648 A1* | 7/2004 | Iwata | G11C 11/15 365/158 |
| 2009/0207642 A1* | 8/2009 | Shimano | G11C 8/04 365/72 |
| 2010/0097845 A1* | 4/2010 | Sakimura | B82Y 10/00 365/158 |
| 2010/0238711 A1 | 9/2010 | Asao | |
| 2010/0265757 A1 | 10/2010 | Otsuka | |

OTHER PUBLICATIONS

Abe, et al., "Novel hybrid DRAM/MRAM design for reducing power of high performance mobile CPU", IEDM Tech. Dig.; pp. 243-246; Dec. 2012.

* cited by examiner

"1" WRITE

"0" WRITE

SEMICONDUCTOR STORAGE DEVICE

CROSS REFERENCE TO RELATED APPLICATIONS

This application is a Continuation of U.S. Ser. No. 14/203,458, filed on Mar. 10, 2014, which is based upon and claims the benefit of priority from the prior U.S. Provisional Patent Application No. 61/874,879, filed on Sep. 6, 2013, the entire contents of which are incorporated herein by reference.

FIELD

The embodiments of the present invention relate to a semiconductor storage device.

BACKGROUND

Conventionally, a sense amplifier used in an MRAM (Magnetoresistive Random Access Memory) or the like detects data by detecting a current (a cell current) running through a memory cell. Therefore, a current-detection sense amplifier for use in the MRAM or the like is larger in size than a voltage-detection sense amplifier for use in an SRAM or the like.

Furthermore, in the MRAM or the like, it is necessary to set a bit line voltage at the time of reading data to an intermediate voltage between a high level voltage (Vdd) and a low level voltage (Vss) to suppress read disturb.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A semiconductor storage device includes a first bit line and a second bit line. A nonvolatile memory element and a first cell transistor are connected in series between the first bit line and the second bit line. A sense transistor has a gate connected to a sense node which is provided between the first bit line and the memory element. A read bit line is connected to a source or a drain of the sense transistor. The read bit line is configured to transmit data of the memory element. A sense amplifier is configured to detect the logic of data transmitted from the read bit line.

(First Embodiment)

Figure 1:
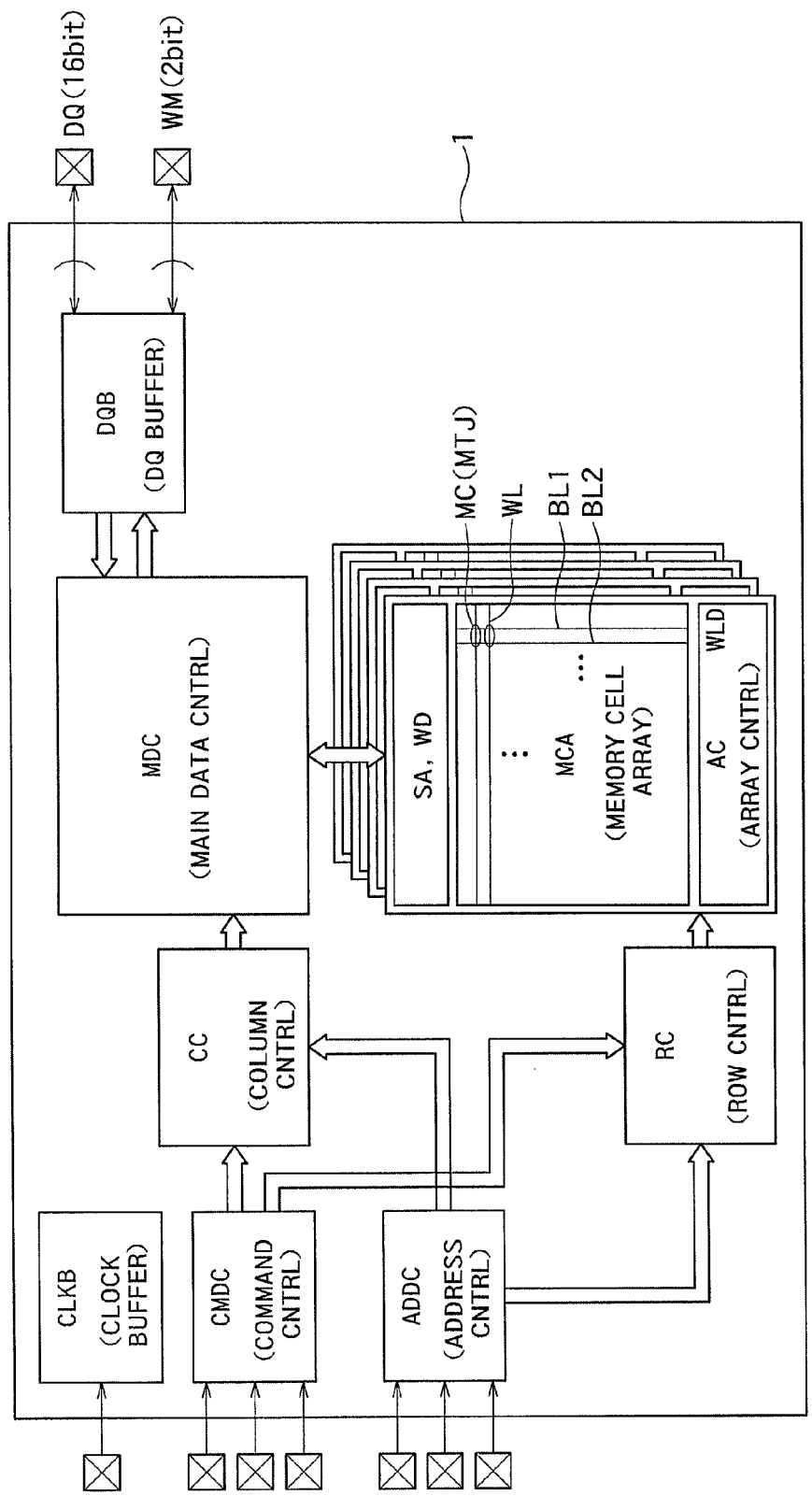
FIG. 1 is a block diagram showing a memory chip of a magnetoresistive random access memory according to a first embodiment.

FIG. 1 is a block diagram showing a memory chip of a magnetoresistive random access memory (hereinafter, "MRAM") according to a first embodiment. The first embodiment is not limited to the MRAM but is also applicable to a memory (a PCRAM or an RRAM, for example) using resistive change elements.

The MRAM according to the first embodiment includes memory cell arrays MCA, sense amplifiers SA, write drivers WD, a main data controller MDC, a DQ buffer DQB, a column controller CC, a row controller RC, a clock buffer CLKB, a command controller CMDC, an address controller ADDC, array controllers AC, and word line drivers WLD.

The memory cell array MCA includes, for example, a plurality of memory cells MC arranged two-dimensionally in a matrix. The memory cells MC are arranged to correspond to intersections between a plurality of pairs of bit lines (BL1 and BL2, for example) and word lines WL, respectively. That is, one end of each memory cell MC is connected to one bit line BL1 of a pair of bit lines BL1 and BL2 and the other end thereof is connected to the other bit line BL2 of the pair of bit lines. The paired bit lines BL1 and BL2 extend in a column direction. The word lines WL extend in a row direction orthogonal to the column direction.

The sense amplifier SA functions to detect data stored in each memory cell MC. In the first embodiment, the sense amplifier SA is a voltage-detection sense amplifier. The write driver WD is connected to the memory cell MC via, for example, the paired bit lines BL1 and BL2 and functions to apply a voltage difference to the memory cell MC for writing data.

The main data controller MDC transfers data received from the DQ buffer DQB to the write driver WD so as to write data to a desired column under control of the column controller CC, or transfers data read from the desired column to the DQ buffer DQB under control of the column controller CC.

The DQ buffer DQB serving as a data buffer temporarily holds read data detected by the sense amplifier SA and outputs the read data to outside of the memory chip 1. Alternatively, the DQ buffer DQB temporarily holds write data received via a DQ pad DQ and transfers the write data to the write driver WD.

The column controller CC controls the sense amplifier SA or the write driver WD to operate so as to selectively drive the bit line BL in the desired column according to a column address.

The row controller RC controls the word line driver WLD to operate so as to selectively drive one desired word line WL according to a row address.

Clock signals for determining an operation timing of the entire memory chip 1 are input to the clock buffer CLKB.

The command controller CMDC receives commands indicating various operations such as a data read operation and a data write operation and controls the column controller CC and the row controller RC according to those commands.

The address controller ADDC receives the row address, the column address, and the like, decodes these addresses, and transmits these addresses to the column controller CC and the row controller RC.

The array controller AC totally controls the memory cell array MCA.

Figure 2:
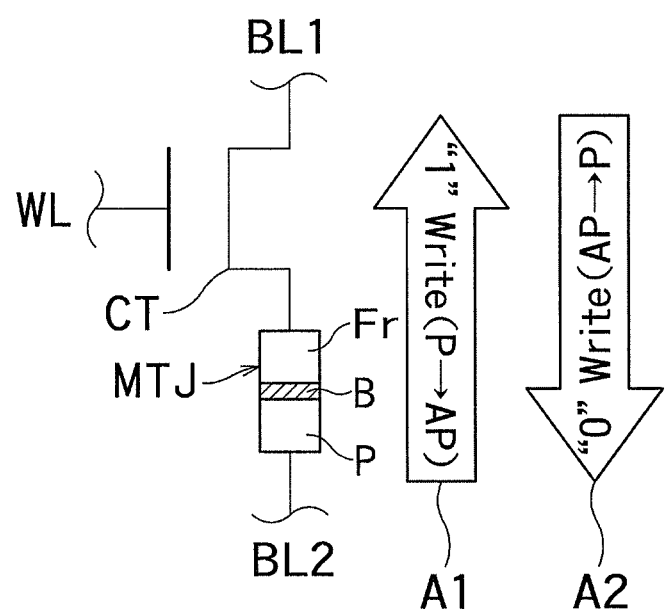
FIG. 2 is an explanatory diagram showing a configuration of the single memory cell MC.

FIG. 2 is an explanatory diagram showing a configuration of the single memory cell MC. Each memory cell MC includes a magnetic tunnel junction (MTJ) element and a cell transistor CT. The MTJ element and the cell transistor CT are connected in series between the bit lines BL1 and BL2. In the memory cell MC, the cell transistor CT is arranged on the side of the bit line BL1 and the MTJ element is arranged on the side of the bit line BL2. A gate of the cell transistor CT is connected to one word line WL. The cell transistor CT is made conductive after the word line WL is driven when the MTJ element connected to the cell transistor CT is selected.

The MTJ element is an STT (Spin Transfer Torque)-MTJ element using a TMR (tunneling magnetoresistive) effect. The STT-MTJ element has a stacked structure constituted by two ferromagnetic layers and a nonmagnetic layer (an insulating thin film) sandwiched between the ferromagnetic layers, and stores digital data by a change in a magnetic resistance resulting from spin-polarized tunneling. The MTJ element can be set in both a low resistance state and a high resistance state depending on magnetization orientations of the two ferromagnetic layers. For example, when it is defined that the low resistance state indicates data "0" and that the high resistance state indicates data "1", one-bit data can be recorded in the MTJ element. Needless to mention, it can be defined that the low resistance state indicates the data "1" and that the high resistance state indicates the data "0." For example, the MTJ element is configured so that a pinned layer P, a tunnel barrier layer B, and a recording layer Fr are sequentially stacked. The pinned layer P and the recording layer Fr are made of a ferromagnetic body whereas the tunnel barrier layer B is made of an insulating film. The pinned layer P is a layer having a fixed magnetization direction, the recording layer Fr is a layer having a variable magnetization direction, and data is recorded in the MTJ element depending on the magnetization direction of the recording layer Fr.

At the time of the data write operation, when a current equal to or higher than an inversion threshold current flows in an arrow A1 direction, then the magnetization direction of the recording layer Fr is anti-parallel to that of the pinned layer P, and the MTJ element becomes the high resistance state (the data "1"). At the time of the data write operation, when the current equal to or higher than the inversion threshold current flows in an arrow A2 direction, then the magnetization direction of the pinned layer P is parallel to that of the recording layer Fr and the MTJ element becomes the low resistance state (the data "0"). In this way, different data can be written to the MTJ element depending on the direction of the current.

In the data read operation performed by the MRAM, the sense amplifier SA detects a difference in a resistance of the memory cell MC by supplying a current (a cell current) to the memory cell MC. At this time, the cell current is lower than the inversion threshold current applied at the time of the data write operation. This naturally follows that a read current is quite low.

For example, types of the sense amplifier SA include a constant-current sense amplifier and a constant-voltage clamp sense amplifier. When the constant-current sense amplifier is used, a voltage difference (a signal difference) between the data "0" and the data "1" is several tens of millivolts. When the constant-voltage clamp sense amplifier is used, a current ratio (a signal ratio) of the data "0" to the data "1" is several microamperes.

Such a low cell current is sensitive to noise. Therefore, in a case of adopting the current-detection sense amplifier as the sense amplifier SA, the sense amplifier SA needs large-sized transistors.

Figure 3:
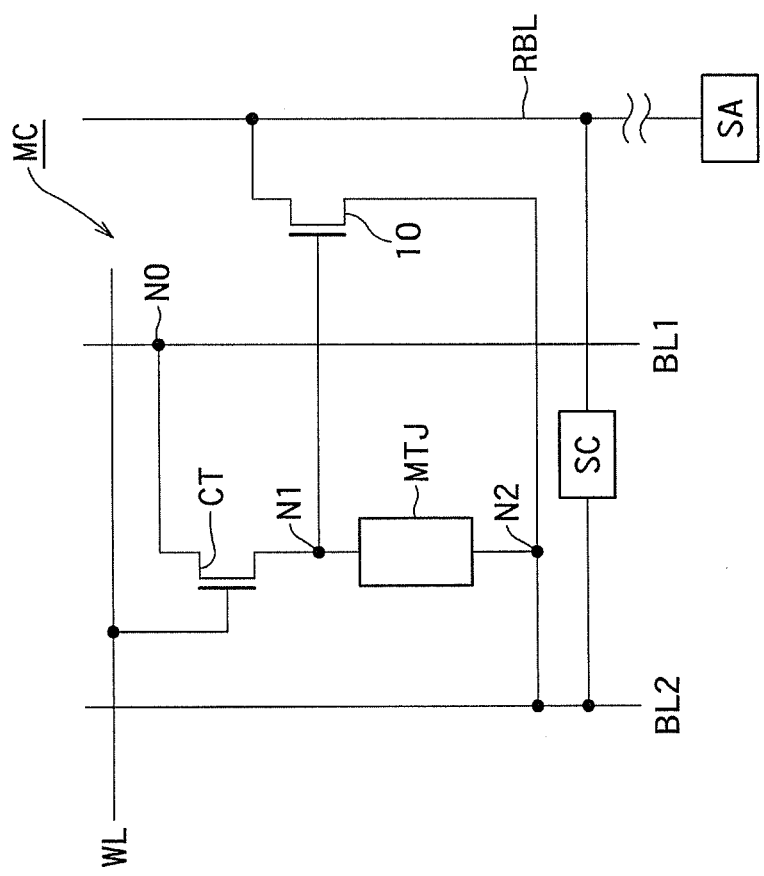
FIG. 3 is an explanatory diagram showing a configuration of a memory cell MC of the MRAM according to the first embodiment.

FIG. 3 is an explanatory diagram showing a configuration of a memory cell MC of the MRAM according to the first embodiment. The MTJ element, the cell transistor CT, the word lines WL, the paired bit lines BL1 and BL2 are already described above with reference to FIG. 2. The MRAM according to the first embodiment further includes read bit lines RBL serving as voltage sense lines, sense transistors 10, and short circuits SC.

The read bit line RBL is provided to correspond to each pair of bit lines BL1 and BL2. The adjacent memory cells MC often share one read bit line RBL. In this case, the read bit line RBL is provided to correspond to a plurality of pairs of bit lines BL1 and BL2.

The read bit line RBL connects a drain (or a source) of the sense transistor 10 to the sense amplifier SA. The read bit line RBL can thereby transmit a voltage of the drain (or the source) of the sense transistor 10 to the sense amplifier SA.

A gate of the sense transistor 10 is connected to a node N1 present between the MTJ element and the cell transistor CT (to a first end of the MTJ element). Furthermore, the sense transistor 10 is connected between the bit line BL2 (a second end of the MTJ element) and the read bit line RBL. That is, the source (or the drain) of the sense transistor 10 is connected to a node N2 present between the second end of the MTJ element and the bit line BL2. The sense transistor 10 detects a voltage of the node N1 and transmits a voltage according to the voltage of the node N1 to the read bit line RBL. The sense transistor 10 is formed using an N-FET (Field Effect Transistor). However, a P-FET can be used to form the sense transistor 10 by inverting signs of voltages applied to the paired bit lines BL1 and BL2.

The sense amplifier SA detects the voltage of the drain (or the source) of the sense transistor 10 transmitted via the read bit line RBL. That is, the sense amplifier SA is the voltage-detection sense amplifier. Because the voltage-detection sense amplifier is well known in relation to memories such as the SRAM, explanations of the configuration of the voltage-detection sense amplifier will be omitted.

For example, it is assumed that the memory cell MC shown in FIG. 3 is selected during the data read operation. It is defined here that a voltage of the bit line BL1 (a node N0) is V0, the voltage of the node N1 is V1, and a voltage of the node N2 is V2. At this time, V1 is a voltage obtained by dividing (V0−V2) by a resistance Rct of the cell transistor CT and a resistance Rmtj of the MTJ element, as represented by Equation (1).

$$V1=(V0-V2)*(Rmtj/(Rct+Rmtj)) \quad (1)$$

The resistance Rmtj is different depending on the logic of data stored in the MTJ element. When the resistance Rmtj is relatively high, the voltage V1 is V1_H. When the resistance Rmtj is relatively low, the voltage V1 is V1_L. Preferably, a threshold voltage Vth of the sense transistor 10 is almost an intermediate voltage between V1_H and V1_L (Vth=(V1_H+V1_L)/2, for example). That is, the threshold voltage Vth of the sense transistor 10 is preferably the intermediate voltage between the voltage V1_L of the node N1 of the MTJ element that stores the data "0" and the voltage V1_H of the node N1 of the MTJ element that stores the data "1". It is thereby possible to obtain a large voltage difference on the read bit line RBL by the logic of the data stored in the MTJ element.

The short circuit SC is connected between the bit line BL2 and the read bit line RBL. The short circuit SC is conductive during the data write operation and makes the voltage of the read bit line RBL identical to that of the bit line BL2. With this configuration, a through current does not run through the sense transistor 10 because of no voltage difference between the read bit line RBL and the bit line BL2 during the data write operation. As a result, at the time of writing data to the MTJ element, the sense transistor 10 and the sense amplifier SA have no adverse effect on the memory cell MC. It suffices to provide the short circuit SC for each pair of bit lines BL1 and BL2 (for each column). It also suffices to form the short circuit SC using transistors.

In this way, the MRAM according to the first embodiment can adopt the voltage-detection sense amplifier as the sense amplifier SA by adding the sense transistor 10 to each memory cell MC and adding the read bit line RBL and the short circuit SC for each pair of bit lines BL1 and BL2.

Figure 4:
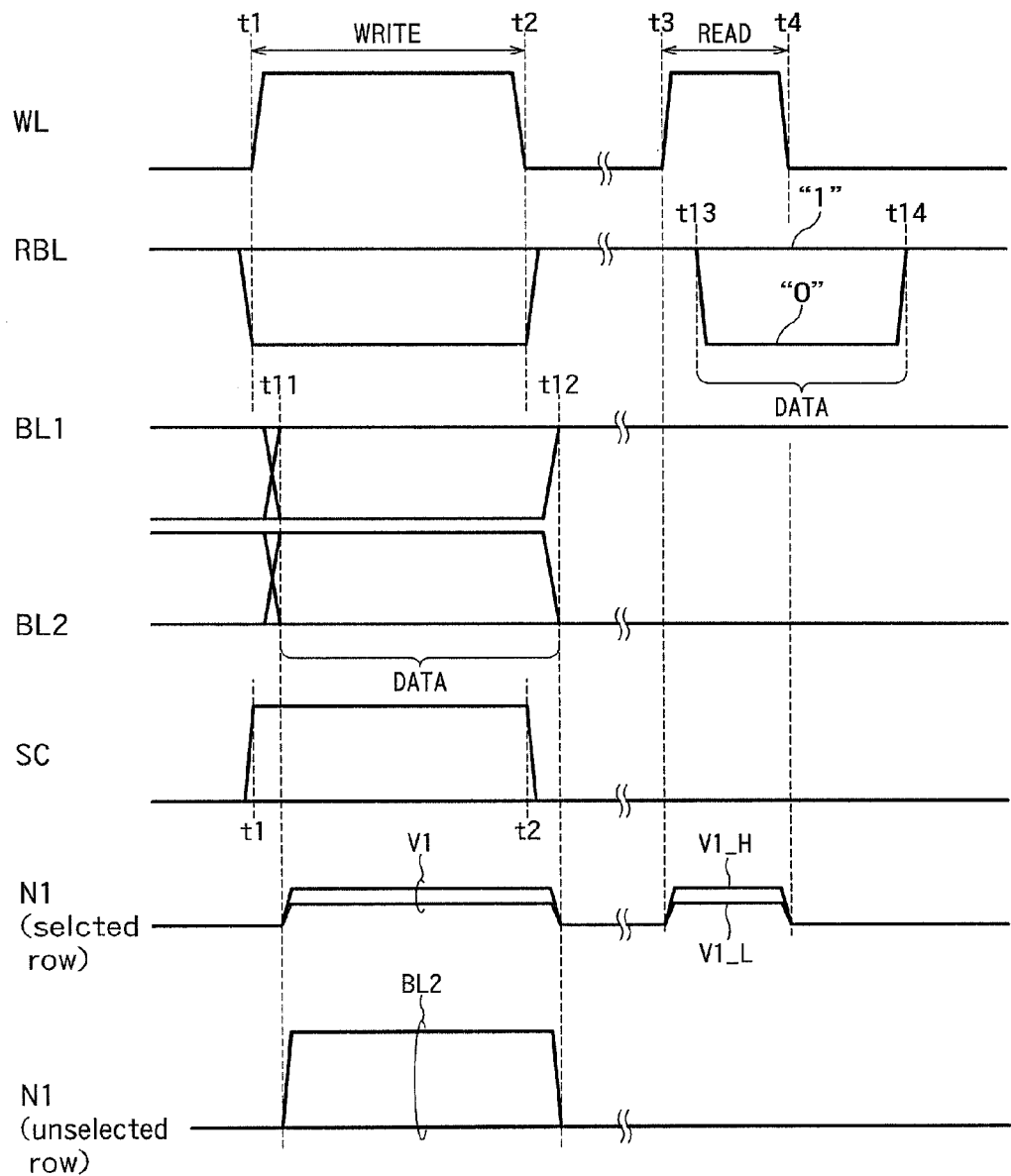
FIG. 4 is a timing chart showing operations performed by the MRAM according to the first embodiment.

FIG. 4 is a timing chart showing operations performed by the MRAM according to the first embodiment. FIG. 4 shows a data write operation from a time t1 to a time t2 and a data read operation from a time t3 to a time t4.

First, at the time t1, the selected word line WL is activated to logical high. Furthermore, the short circuit SC is conductive and short circuits the read bit line RBL to the bit line BL2. With this configuration, during the data write operation, the voltage of the read bit line RBL is kept identical to that of the bit line BL2.

Next, at a time t11, the write data is transmitted to the selected paired bit lines BL1 and BL2. For example, in a case of applying a current in the arrow A1 direction shown in FIG. 2, the voltage of the bit line BL1 becomes a low level voltage and that of the bit line BL2 is set to a high level voltage. On the other hand, in a case of applying the current in the arrow A2 direction, the voltage of the bit line BL1 becomes the high level voltage and that of the bit line BL2 is set to the low level voltage.

The voltages of the selected paired bit lines BL1 and BL2 determine the voltage V1 of the node N1 in a selected row as the voltage obtained by resistance division using the cell transistor CT and the MTJ element, as represented by Equation (1). During the data write operation similarly to the data read operation, the voltages of the selected paired bit lines BL1 and BL2 determine the voltage V1. Because each cell transistor CT is nonconductive in unselected rows, the voltage of each node N1 in the unselected rows is identical to the voltage of the bit line BL2.

Because the voltages of the paired bit lines BL1 and BL2 in unselected columns are both kept to the low level voltage, the voltage of each node N1 in the unselected columns is the low level voltage.

Thereafter, at the time t2, the selected word line WL is deactivated to logical low, whereby the MRAM ends the data write operation. During the data write operation, the sense transistor 10 and the sense amplifier SA do not operate.

During the data read operation, first at the time t3, the selected word line WL is activated to logical high. At this time, the voltage difference is given between the selected bit lines BL1 and BL2 and the voltage difference is applied to the MTJ element of the selected memory cell MC. For example, in FIG. 4, the high level voltage is applied to the bit line BL1 and the low level voltage is applied to the bit line BL2. The voltage V1 of the node N1 thereby becomes either V1_L or V1_H depending on the logic of the data stored in the MTJ element. The voltages of the unselected paired bit lines BL1 and BL2 are kept to the low level voltage.

For example, when the data stored in the MTJ element is "1" and the MTJ element is in the low resistance state, the voltage V1 of the node N1 is V1_L. The sense transistor 10 is thereby kept nonconductive or in a high resistance state. As a result, the voltage of the read bit line RBL precharged with the high level voltage is kept to the high level voltage.

For example, when the data stored in the MTJ element is "0" and the MTJ element is in the high resistance state, the voltage V1 of the node N1 is V1_H. The sense transistor 10 is thereby made conductive or in the low resistance state. As a result, the voltage of the read bit line RBL precharged with the high level voltage becomes the low level voltage.

The sense amplifier SA can read the data stored in the selected memory cell MC by detecting the voltage level of the read bit line RBL.

At the time t4, the selected word line WL is deactivated to logical low, whereby the MRAM ends the data read operation.

The data read period from the time t3 to the time t4 is set shorter than the data write period from the time t1 to the time t2. This makes it possible to read the data in a nondestructive manner. That is, in the data read operation shown in FIG. 4, there is no need to rewrite the data to the memory cell MC.

In the data write operation, a write error rate becomes higher as a time for applying the current to the MTJ element is shorter. This means that, in the data read operation, a probability of destructing the data stored in the MTJ element becomes lower as the time for applying the current to the MTJ element is shorter. Therefore, by setting the data read period shorter as described in the first embodiment, the data can be read in a nondestructive manner.

According to the first embodiment, the MRAM can adopt the voltage-detection sense amplifier as the sense amplifier SA by adding the sense transistor 10 to each memory cell MC and adding the read bit line RBL for each column. The voltage-detection sense amplifier is strong against noise and advantageous for downscaling purposes. For example, it is only about eight current-detection sense amplifiers that can be arranged per 1-megabit memory cell array (mat). In contrast, it is 256 or more voltage-detection sense amplifiers that can be arranged per 1-megabit memory cell array. Therefore, in the first embodiment, an area of one sense amplifier SA is quite small or the number of sense amplifiers SA can be greatly increased although it is necessary to arrange the cell transistors 10 and the read bit lines RBL, which makes an area of one memory cell array large. That is, in the first embodiment, the sense amplifier SA can be provided for each column. This means that the MRAM can perform a fast data read operation. For example, a read rate of the MRAM according to the first embodiment is almost equal (about 1 ns to 2 ns) to that of the SRAM.

Generally, each memory cell of the SRAM is constituted by six transistors. Furthermore, each memory cell of the SRAM needs a sense transistor and a switching transistor. The switching transistor is a transistor that disconnects the sense transistor from the read bit line when the memory cell is unselected. In this manner, each memory cell of the SRAM needs at least eight transistors as a whole.

In contrast, each memory cell MC of the MRAM according to the first embodiment can be constituted only by the MTJ element, the cell transistor CT, and the sense transistor 10. Therefore, as compared with the memory cell of the SRAM, the memory cell MC of the MRAM according to the first embodiment is quite small.

In this way, the memory cells MC of the MRAM according to the first embodiment can be made smaller in area than the memory cells of the SRAM while ensuring the read rate almost equal to that of the SRAM.

The MRAM according to the first embodiment can dispense with the switching transistor differently from the SRAM for the following reasons. When one memory cell MC of the MRAM is unselected, the voltage V1 of the node N1 of the memory cell MC is fixed to a voltage (a low level voltage, for example) identical to the voltage of the bit line BL2 irrespectively the logic of the data stored in the MTJ element. Therefore, the sense transistor 10 of the unselected memory cell MC does not operate even without the switching transistor.

In the first embodiment, the high level voltage and the low level voltage are used but the intermediate voltage between the high level voltage and the low level voltage is not used. Therefore, the MRAM according to the first embodiment can dispense with a power supply circuit that generates the intermediate voltage.

Figure 5:
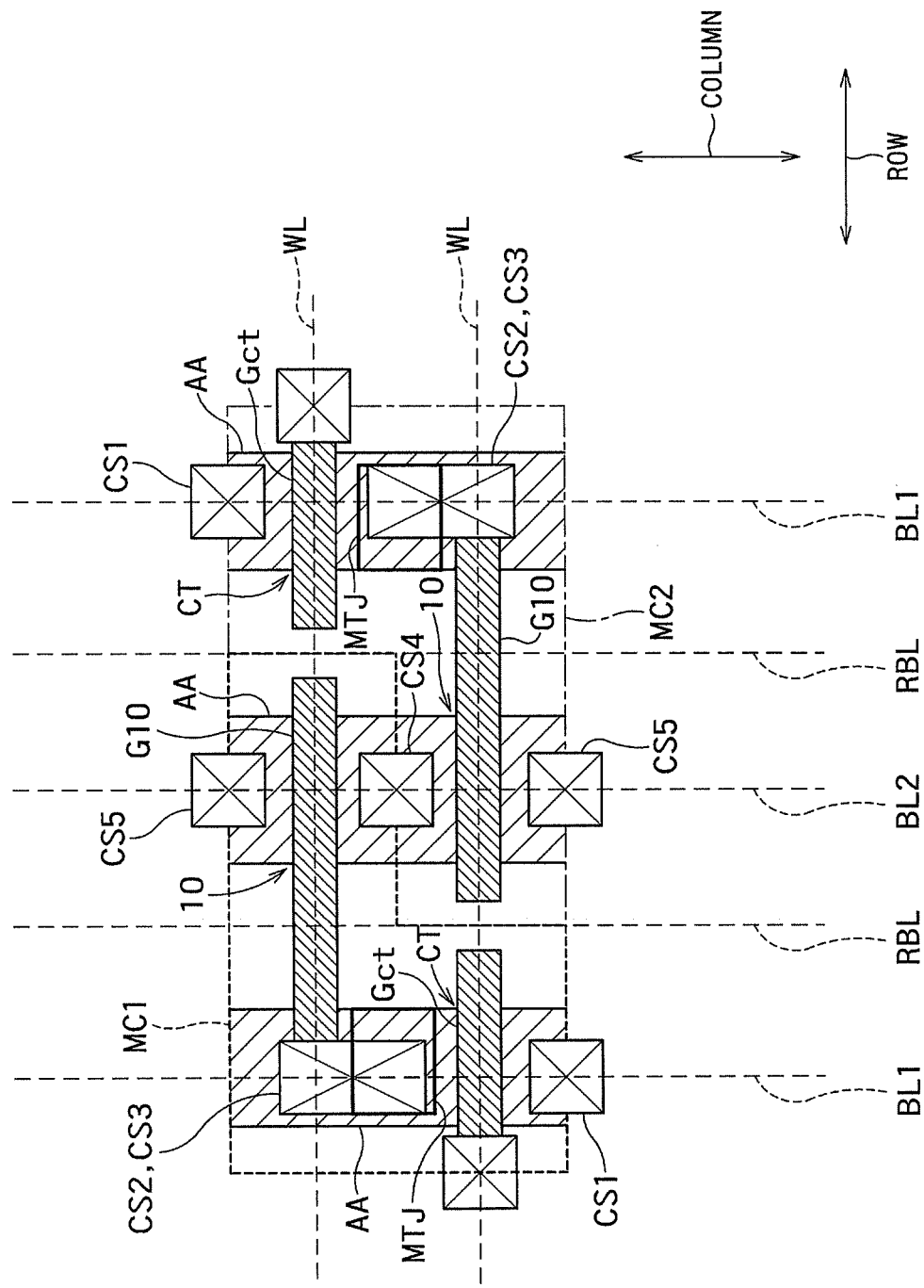
FIG. 5 shows an example of a layout according to the first embodiment.

FIG. 5 shows an example of a layout according to the first embodiment. In FIG. 5, the bit line BL2 is shared between the two memory cells MC1 and MC2 that are adjacent in the row direction. Each of the memory cells MC1 and MC2 adjacent in the row direction has an L-shaped layout. An arrangement in which one memory cell MC1 is rotated about the bit line BL2 and inverted vertically corresponds to an arrangement of the other memory cell MC2 adjacent to the memory cell MC1. The layout of the two memory cells MC1 and MC2 adjacent in the row direction thereby forms one rectangle. By arranging rectangles of this form continuously in the row and column directions, the layout of the MRAM according to the first embodiment is obtained.

Reference character AA denotes an active area. Each bit line BL1 is connected to a drain of each cell transistor CT via a contact plug CS1. A source of the cell transistor CT is connected to a lower end of the MTJ element and a gate G10 of the sense transistor 10 via a contact plug CS2. Reference character Gct denotes a gate of the cell transistor CT. An upper end of the MTJ element is connected to the bit line BL2 via a contact plug CS3 and a first metal layer M1 (not shown). Furthermore, the bit line BL2 is connected to the source of the cell transistor 10 via a contact plug CS4. The drain of the sense transistor 10 is connected to the read bit line RBL via a contact plug CS5.

FIG. 5 shows two memory cells MC that are adjacent in the row direction. These two memory cells MC share one bit line BL2. Accordingly, the contact plugs CS4 and CS5 alternately appear along the bit line BL2.

The size of each of these memory cells MC is 30 $F^2$. F (Feature Size) indicates a minimum feature size in semiconductor manufacturing processes.

Figure 6:
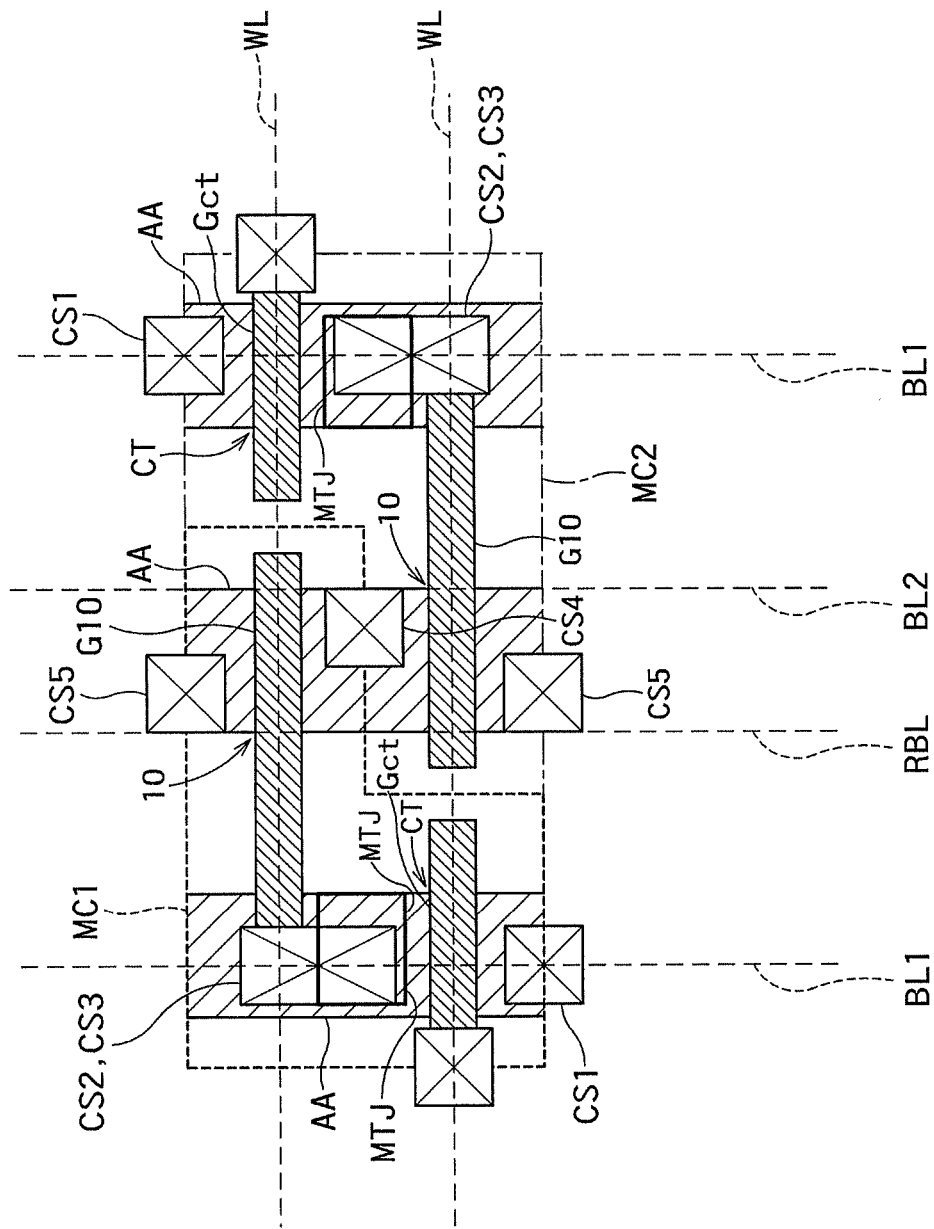
FIG. 6 shows another example of the layout according to the first embodiment.

FIG. 6 shows another example of the layout according to the first embodiment. In the layout of FIG. 5, the contact plugs CS4 and CS5 are arranged linearly along the bit line BL2. In contrast, in the layout of FIG. 6, the contact plugs CS4 and CS5 are arranged in a staggered manner in an extending direction of the bit line BL2 and the read bit line RBL. With this arrangement, in the layout of FIG. 6, both the bit line BL2 and the read bit line RBL are shared between the two memory cell MC1 and MC2 that are adjacent in the row direction. The contact plug CS4 is shared between the two memory cells MC1 and MC2 adjacent in the row direction. The layout of other constituent elements can be identical to that shown in FIG. 5. No problem occurs to the layout of FIG. 6 because the memory cells MC1 and MC2 are not selected simultaneously during the data write operation or the data read operation.

(First Modification of First Embodiment)

Figure 7:
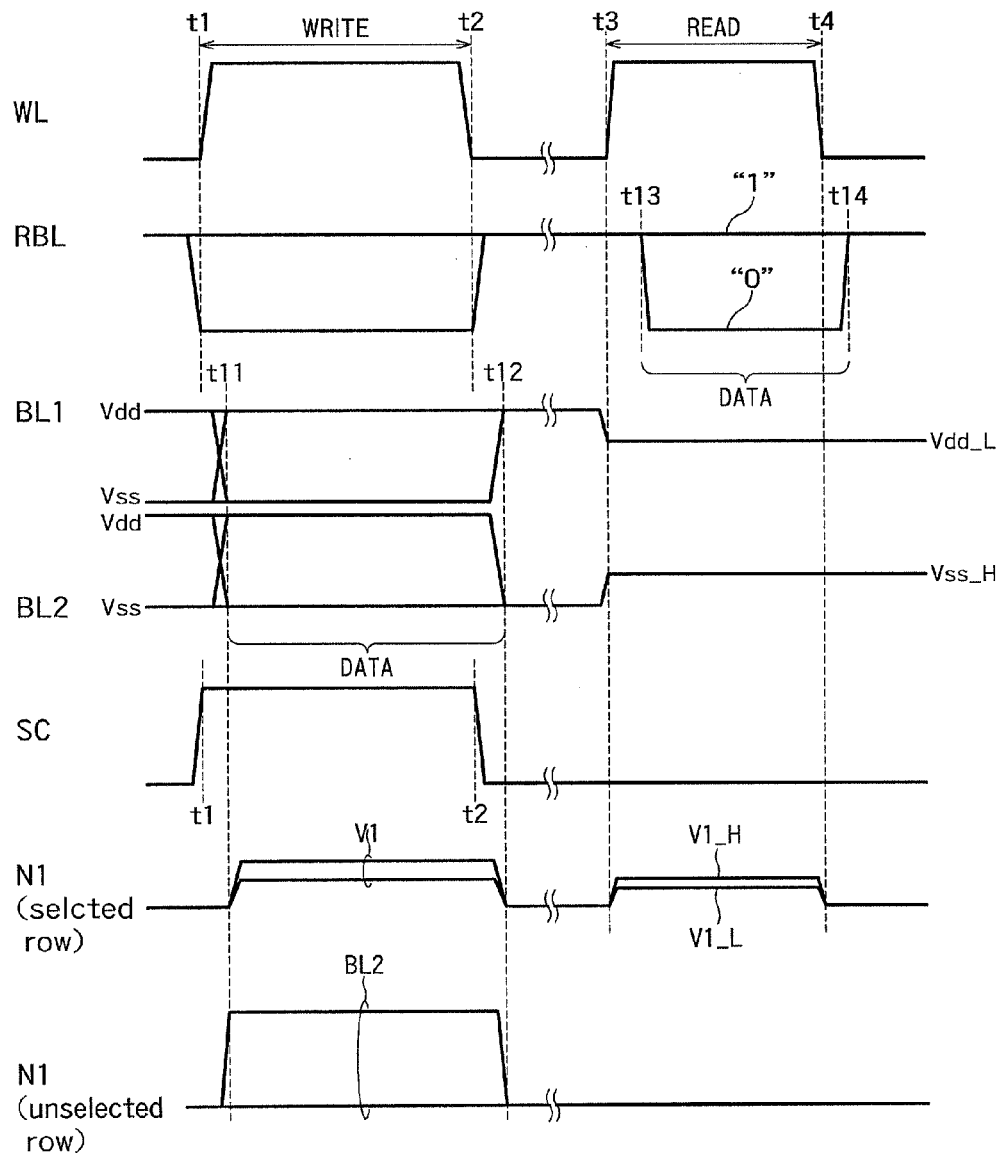
FIG. 7 is a timing chart showing operations performed by an MRAM according to a first modification of the first embodiment.

FIG. 7 is a timing chart showing operations performed by an MRAM according to a first modification of the first embodiment. Configurations of the MRAM according to the first modification can be identical to those of the MRAM according to the first embodiment.

In the first modification, the voltage difference between the selected paired bit lines BL1 and BL2 during the data read operation is smaller than that during the data write operation. For example, when the voltages of the selected paired bit lines BL1 and BL2 during the data write operation are Vdd and Vss, respectively, those of the selected paired bit lines BL1 and BL2 during the data read operation are Vdd_L and Vss_H, respectively. The voltage Vdd_L is lower than Vdd and higher than Vss_H. The voltage Vss_H is higher than Vss and lower than Vdd_L.

In this way, by making small the voltage difference (Vdd_L−Vss_H) between the selected paired bit lines BL1 and BL2 during the data read operation, the data read period from the time t3 to the time t4 can be lengthened without destruction of the data stored in the memory cell MC.

Following the setting of the voltages of the selected paired bit lines BL1 and BL2 to Vdd_L and Vss_H, respectively, a voltage difference (V1_H−V1_L) of the node N1 is smaller than that according to the first embodiment.

Other operations of the first modification are identical to those of the first embodiment. Therefore, the first modification can achieve effects identical to those of the first embodiment. In the first modification, the MRAM needs a power supply circuit that generates the voltages Vdd_L and Vss_H between the high level voltage Vdd and the low level voltage Vss.

In the first modification, during the data read operation, the voltages of both the bit lines BL1 and BL2 are shifted from the high level voltage Vdd and the low level voltage Vss, respectively. However, the voltage of only one of the bit lines BL1 and BL2 can be shifted. With this configuration, the voltage V1 of the node N1 can be adjusted during the data read operation. That is, the voltage of the bit line BL1 or BL2 during the data read operation can be shifted so that an intermediate voltage between the voltages V1_L and V1_H can be set almost identical to the threshold voltage Vth of the sense transistor 10.

(Second Modification of First Embodiment)

Figure 8:
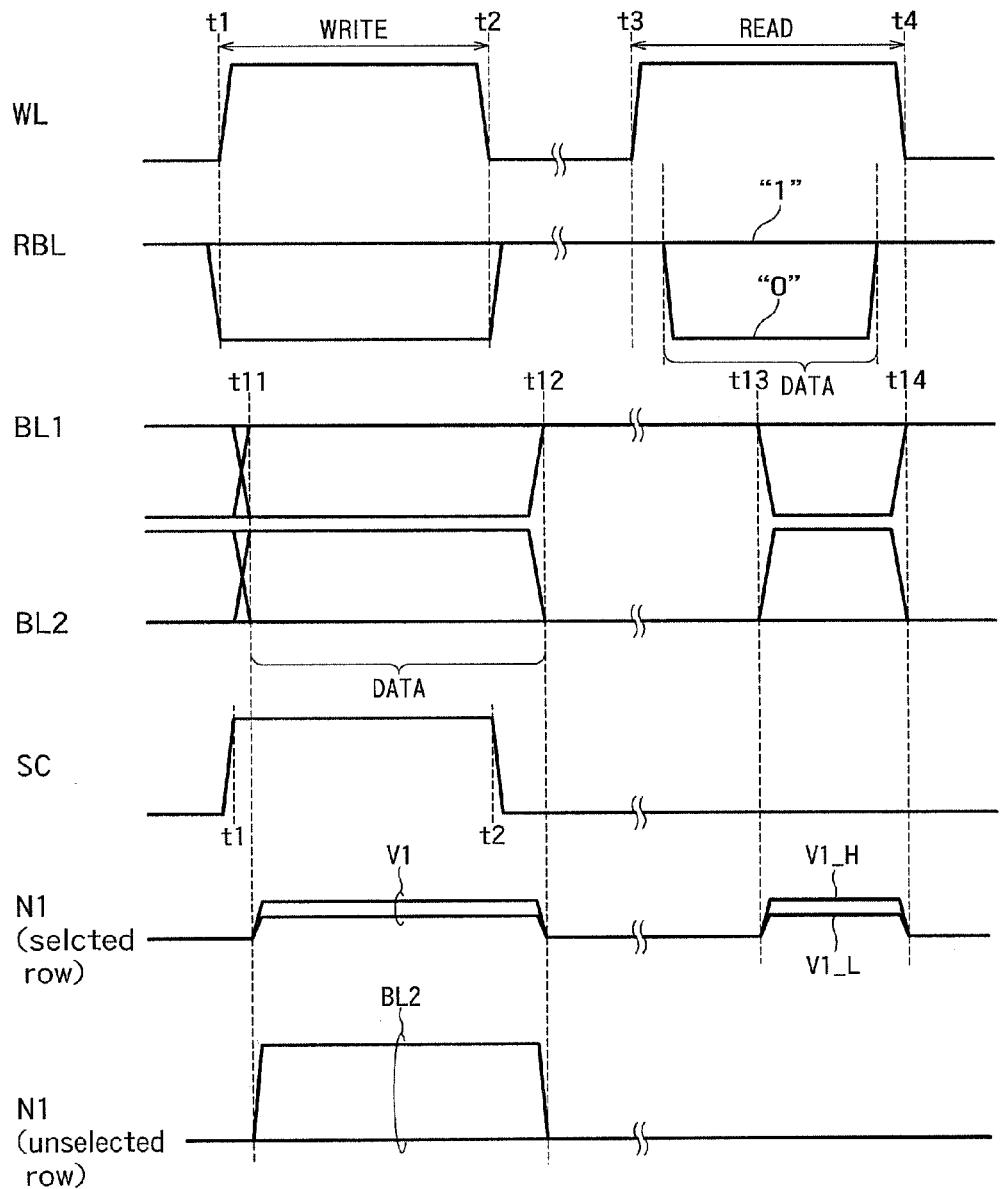
FIG. 8 is a timing chart showing operations performed by an MRAM according to a second modification of the first embodiment.

FIG. 8 is a timing chart showing operations performed by an MRAM according to a second modification of the first embodiment. Configurations of the MRAM according to the second modification can be identical to those of the MRAM according to the first embodiment.

In the second modification, the MRAM performs a write-back operation on the assumption that the data stored in the memory cell MC is destructed during the data read operation. In this case, a period from a time t13 to a time t14 within the data read period from the time t3 to the time t4 is a write-back period. With the write-back operation, even if the data stored in the memory cell MC is destructed during the data read operation, the destructed data can be returned to the original data stored in the memory cell MC by writing back the data to the memory cell MC.

Other operations of the second modification are identical to those of the first embodiment. Therefore, the second modification can achieve effects identical to those of the first embodiment. In the second modification, there is no need to shorten the data read period from the time t3 to the time t4.

(Second Embodiment)

Figure 9:
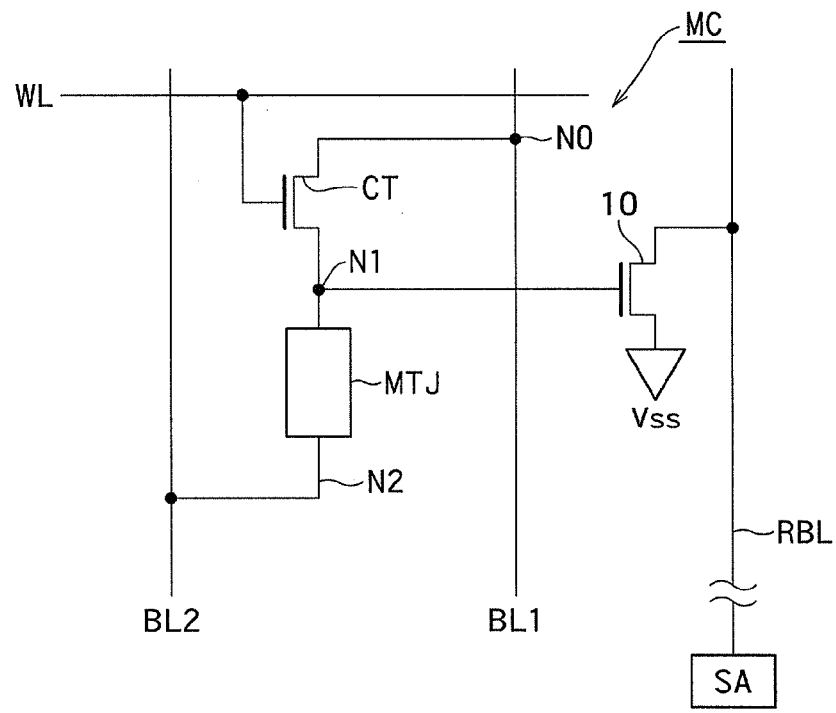
FIG. 9 is an explanatory diagram showing a configuration of the memory cell MC of an MRAM according to a second embodiment.

FIG. 9 is an explanatory diagram showing a configuration of the memory cell MC of an MRAM according to a second embodiment. In the second embodiment, a source (or a drain) of the sense transistor 10 is connected to the low level voltage Vss (a ground voltage) and the MRAM does not include the short circuits SC. Other configurations of the second embodiment can be identical to corresponding ones of the first embodiment.

In the second embodiment, the sense transistor 10 is connected between the read bit line RBL and the low level voltage Vss. Even if the source (or the drain) of the sense transistor 10 is fixed to the low level voltage Vss (the ground voltage) as shown in FIG. 9, the MRAM according to the second embodiment can operate similarly to that according to the first embodiment. Therefore, the second embodiment can achieve effects identical to those of the first embodiment.

However, in the second embodiment, it is necessary to set the read bit line RBL in an electrically floating state during the data write operation because the MRAM does not include the short circuits SC.

The first and second modifications described above can be also applied to the second embodiment.

(Third Embodiment)

Figure 10:
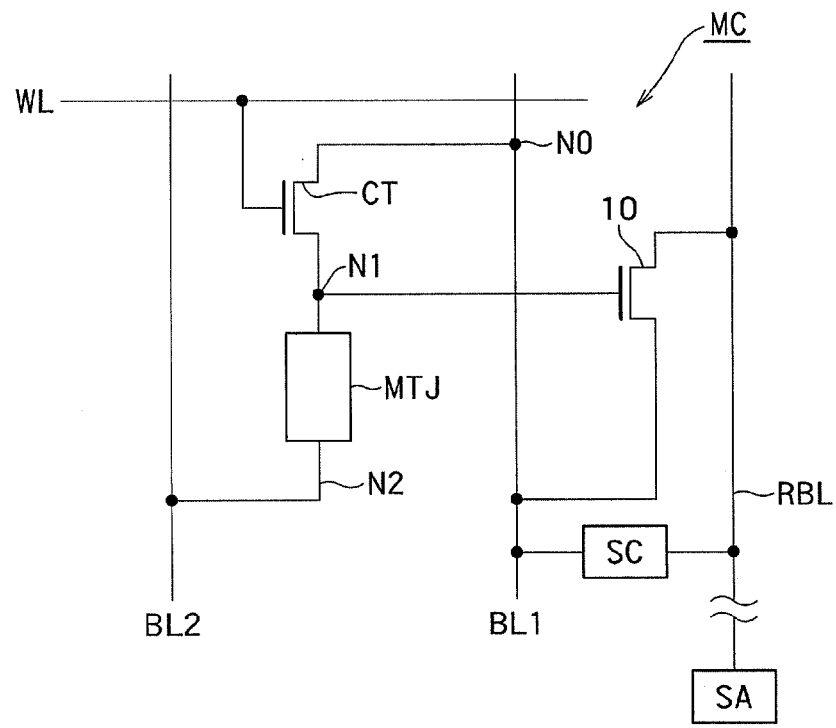
FIG. 10 is an explanatory diagram showing a configuration of the memory cell MC in an MRAM according to a third embodiment.

FIG. 10 is an explanatory diagram showing a configuration of the memory cell MC in an MRAM according to a third embodiment. In the third embodiment, a source (or a drain) of the sense transistor 10 is connected to the bit line BL1. Furthermore, the short circuit SC is connected between the bit line BL1 and the read bit line RBL. Other configurations of the third embodiment can be identical to corresponding ones of the first embodiment.

Figure 11:
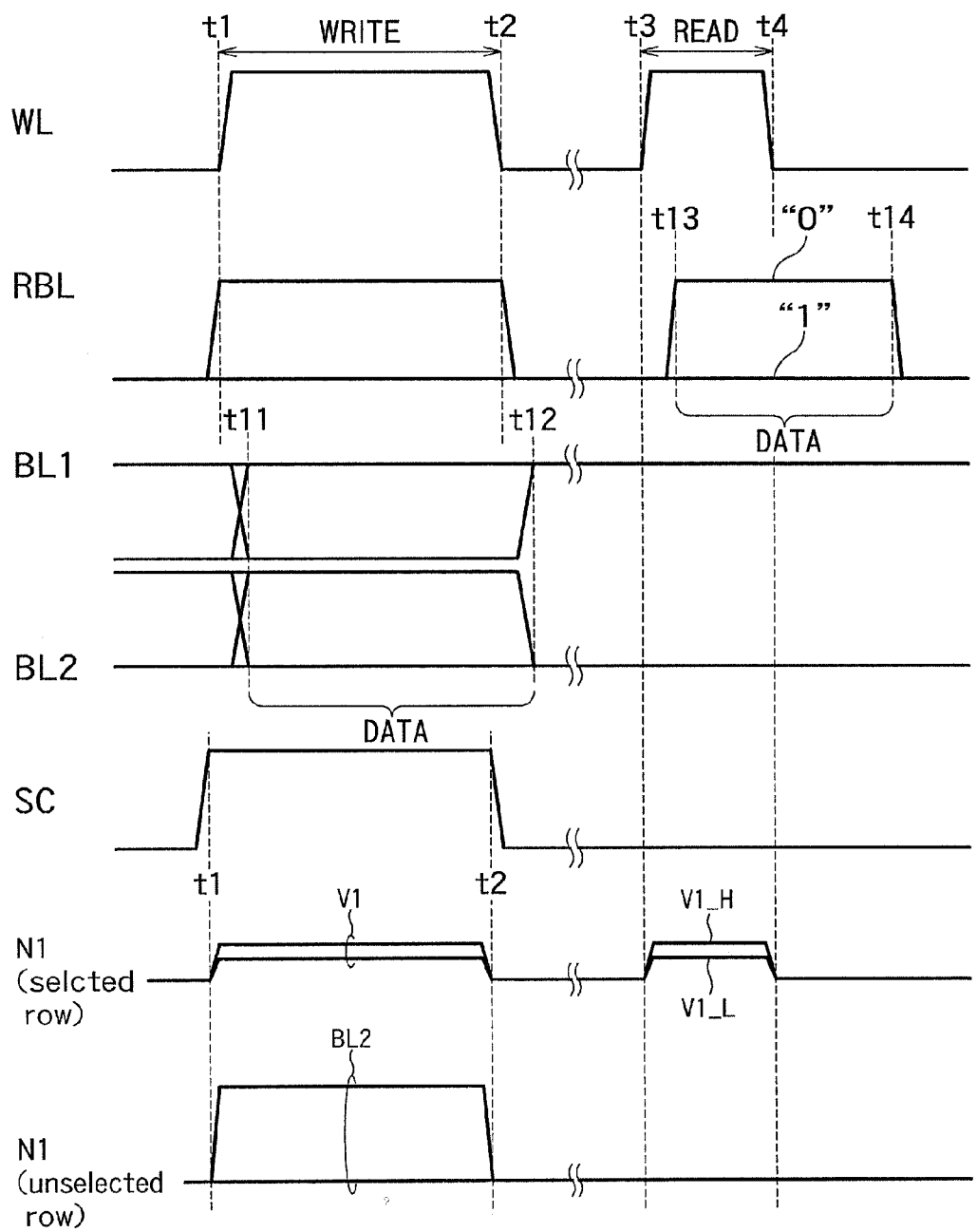
FIG. 11 is a timing chart showing operations performed by the MRAM according to the third embodiment.

FIG. 11 is a timing chart showing operations performed by the MRAM according to the third embodiment. In the third embodiment, the sense transistor 10 is connected between the bit line BL1 and the read bit line RBL. Accordingly, the read bit line RBL is precharged with the low level voltage Vss before a data read operation. At the time of a data read operation, the voltage of the read bit line RBL either transitions to the high level voltage Vdd or is kept to the low level voltage Vss depending on the logic of the data stored in the selected memory cell MC.

For example, when the data stored in the MTJ element is "1" and the MTJ element is in the low resistance state, the voltage V1 of the node N1 is V1_L. The sense transistor 10 is thereby kept nonconductive or in the high resistance state. As a result, the voltage of the read bit line RBL precharged with the low level voltage is kept to the low level voltage.

For example, when the data stored in the MTJ element is "0" and the MTJ element is in the high resistance state, the voltage V1 of the node N1 is V1_H. The sense transistor 10 is thereby made conductive or in the low resistance state. As a result, the voltage of the read bit line RBL precharged with the low level voltage is made the high level voltage.

In this manner, in the third embodiment, the operation of the voltage of the read bit line RBL is opposite to that in the first embodiment. Other operations of the third embodiment are identical to those of the first embodiment.

Therefore, the third embodiment can achieve effects identical to those of the first embodiment. The first and second modifications described above can be also applied to the third embodiment.

(Fourth Embodiment)

Figure 12:
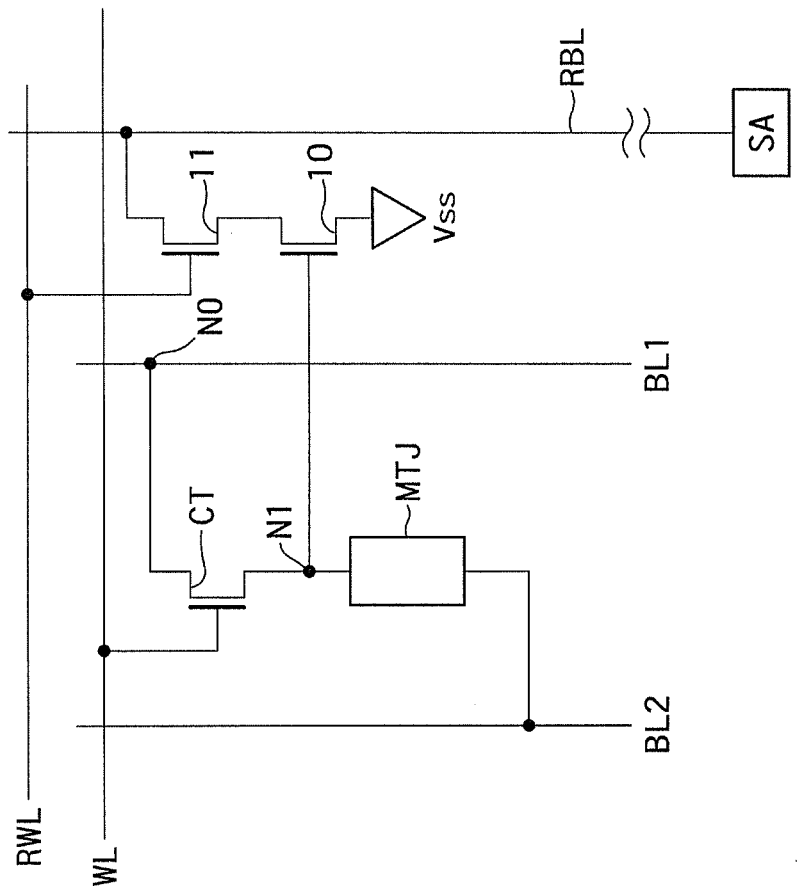
FIG. 12 is an explanatory diagram showing a configuration of the memory MC in an MRAM according to a fourth embodiment.

FIG. 12 is an explanatory diagram showing a configuration of the memory MC in an MRAM according to a fourth embodiment. In the fourth embodiment, a drain (or a source) of the sense transistor 10 is connected to the read bit line RBL via a switching transistor 11. A gate of the switching transistor 11 is connected to a read word line RWL driven at the time of reading data. Other configurations of the fourth embodiment can be identical to corresponding ones of the second embodiment.

Figure 13:
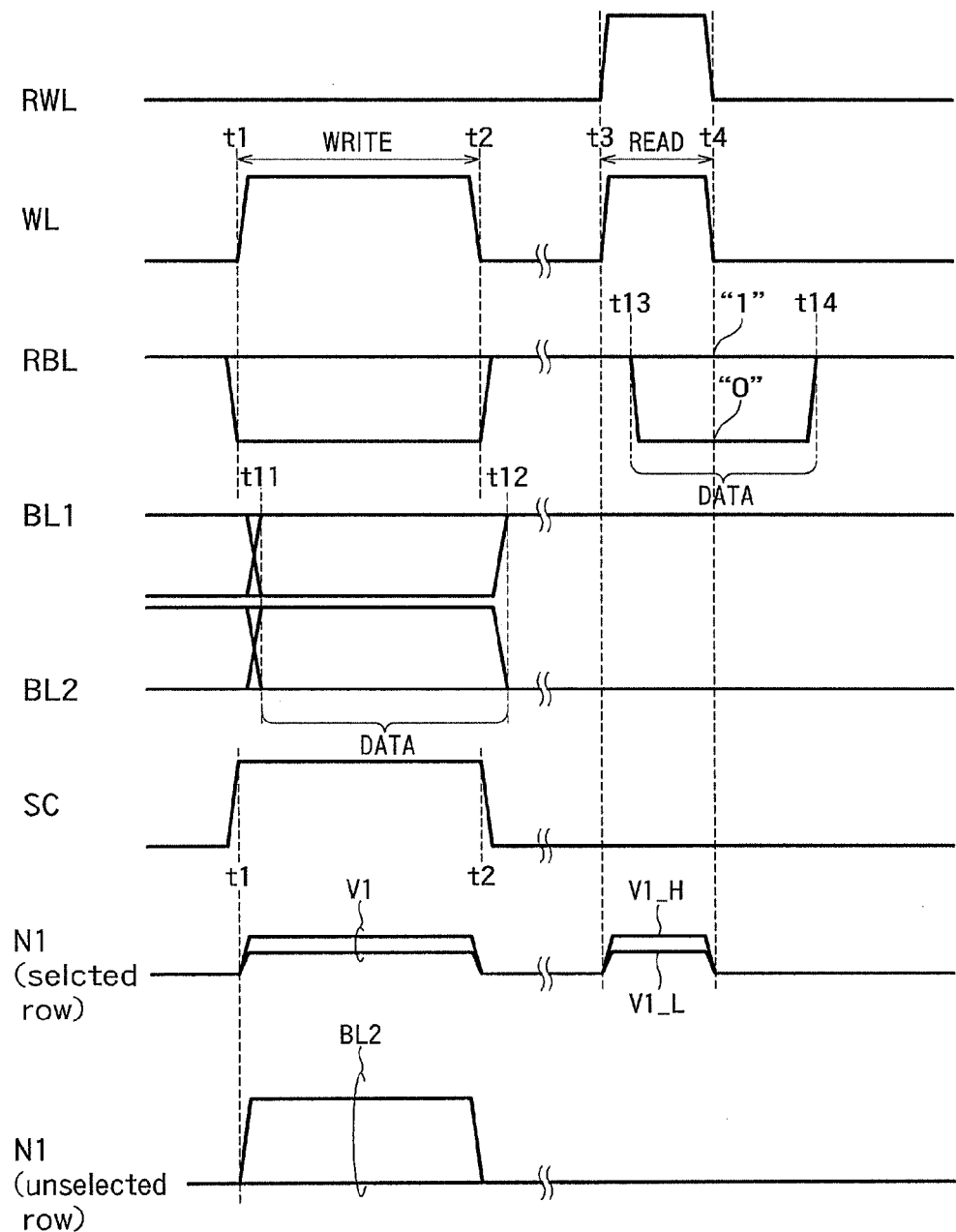
FIG. 13 is a timing chart showing operations performed by the MRAM according to the fourth embodiment.

FIG. 13 is a timing chart showing operations performed by the MRAM according to the fourth embodiment. In the fourth embodiment, the read word line RWL is active in the data read period from the time t3 to the time t4 and inactive in the other periods. The switching transistor 11 is thereby conductive in the data read period from the time t3 to the time t4. That is, the switching transistor 11 connects the sense transistor 10 to the read bit line RBL in the data read period but disconnects the sense transistor 10 from the read bit line RBL in the other periods. The read bit line RBL can be precharged with the high level voltage in the periods other than the data read period. That is, it is unnecessary to set the read bit line RBL to a floating state. Other operations of the fourth embodiment can be identical to those of the second embodiment. Therefore, the fourth embodiment can achieve effects identical to those of the second embodiment.

In the fourth embodiment, each memory cell MC of the MRAM includes the switching transistor 11 similarly to the SRAM. However, as compared with the memory cell of the SRAM that requires eight transistors, the memory cell MC of the MRAM according to the fourth embodiment is still small in size. Furthermore, the MRAM according to the fourth embodiment is advantageous over the SRAM in that the MRAM is a nonvolatile memory.

As described above, the MRAM according to the fourth embodiment is a promising memory that can replace the SRAM. For example, a conventional processor includes a fast accessible SRAM as a cache memory used in a chip. However, it is expected that an area of a memory part in the processor will increase in the future and it is desired to suppress power consumption in a standby state. To deal with this problem, it is considered to replace the SRAM used as the cache memory by a nonvolatile memory such as the MRAM. This can decrease a layout area of the cache memory and suppress the power consumption in the standby state. As a result, it is possible to realize such a technique as normally-OFF computing for purposes of decreasing the power consumption of the processor.

Still another embodiment is described next.

(Fifth Embodiment)

Figure 14:
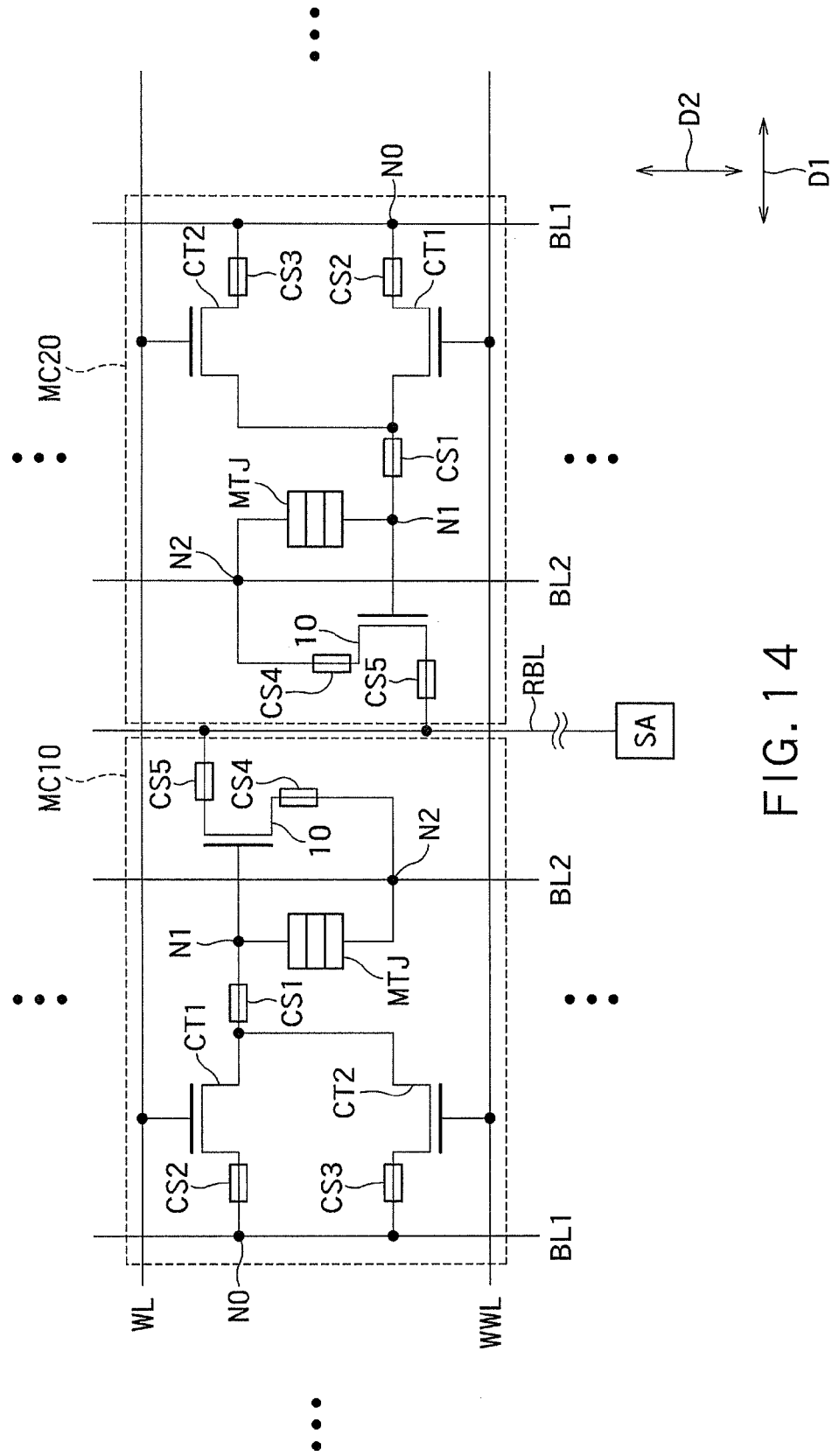
FIG. 14 is an explanatory diagram showing an example of a configuration of the memory cells MC in an MRAM according to a fifth embodiment.

FIG. 14 is an explanatory diagram showing an example of a configuration of the memory cells MC in an MRAM according to a fifth embodiment. The MRAM according to the fifth embodiment includes the first bit lines BL1, the second bit lines BL2, the MTJ elements, first cell transistors CT1, second cell transistors CT2, the sense transistors 10, the read bit lines RBL, and the sense amplifiers SA. Configurations and connection relations of the first bit line BL1, the second bit line BL2, the MTJ element, the sense transistor 10, the read bit line RBL, and the sense amplifier SA can be identical to those according to the first embodiment.

On the other hand, differently from the first embodiment, the two cell transistors CT1 and CT2 are provided for each memory cell MC as the cell transistors CT. The first and second cell transistors CT1 and CT2 are connected in parallel between the node (hereinafter, "sense node") N1 on one end of the MTJ element and the first bit line BL1 (node N0). Following the first and second cell transistors CT1 and CT2, two word lines WL and WWL are provided for each memory cell MC as the word lines WL. The first word line WL (hereinafter, simply "word line WL") is connected to a gate of the first cell transistor CT1 and controls the first cell transistor CT1 to be turned on or off. The second word line WWL (hereinafter, simply "word line WWL") is connected to a gate of the second cell transistor CT2 and controls the second cell transistor CT2 to be turned on or off.

The read bit line RBL shares the word lines WL and WWL extending in a D1 direction and is shared between two memory cells MC10 and MC20 that are adjacent in the D1 direction. Each of the memory cells MC10 and MC20 includes the MTJ element, the cell transistors CT1 and CT2, and the sense transistor 10. By rotating an arrangement of one memory cell MC10 about the read bit line RBL and inverting the arrangement vertically, an arrangement of the other memory cell MC20 adjacent to the memory cell MC10 is obtained. In this way, the memory cells MC10 and MC20 are vertically inverted with respect to each other. Therefore, the word lines WL and WWL for the memory cell MC10 correspond to the word lines WWL and WL for the memory cell MC20, respectively. Layouts of the memory cells MC10 and MC20 are described later.

In FIG. 14, reference characters CS1 to CS4 denote the contact plugs each electrically connecting the first metal layer M1 to a gate electrode or a diffusion layer (the active area AA). In the fifth embodiment, it can be said that the contact plugs CS1 to CS4 and the MTJ element substantially determine resistances among the constituent elements. Therefore, when a voltage is applied between the first and second bit lines BL1 and BL2 (hereinafter, also simply "bit lines BL1 and BL2"), a voltage of the sense node N1 is the voltage obtained by resistance division using the contact plugs CS1 to CS4 and the MTJ element. For example, it is assumed that the voltage of 1.2 V is applied between the bit lines BL1 and BL2 and that a resistance of each of the contact plugs CS1 to CS4 is 2.5 ohms. It is also assumed that the resistance of the MTJ element that stores the data "1" (the MTJ element in the high resistance state) is 15 ohms, that of the MTJ element that stores the data "0" (the MTJ element in the low resistance state) is 5 ohms. In this case, the voltage of the sense node N1 of the memory cell MC10 storing the data "1" is about 0.9 V (0.9 V=1.2×¾) and that of the sense node N1 of the memory cell MC10 storing the data "0" is about 0.6 V (0.6 V=1.2×½). In this manner, the voltage difference between the data "1" and the data "0" on the sense node N1 is about 0.3 V. The threshold voltage Vth of the sense transistor 10 is set to fall within a range of the voltage difference of about 0.3 V. With this configuration, the sense transistor 10 is kept to be turned on when the data "1" is stored in the memory cell MC10 and kept to be turned off when the data "0" is stored in the memory cell MC10.

The threshold voltage Vth of the sense transistor 10 often varies among chips, wafers or lots because of process variations or the like. In such a case, it suffices to adjust the voltages of the bit lines BL1 and BL2 for each chip, for each wafer or for each lot so as to ensure that the cell transistor 10 can be turned on or off depending on the logic of the data. For example, the high level voltage applied to the bit lines BL1 and BL2 is not necessarily the power supply voltage Vdd but can be set to Vdd−ΔVdd. The low level voltage applied to the bit lines BL1 and BL2 is not necessarily the ground voltage Vss but can be set to Vss+ΔVss.

Other configurations of the fifth embodiment can be identical to corresponding ones of the first embodiment as described above. FIG. 14 shows only one pair of memory cells MC10 and MC20 that are adjacent to each other. However, many pairs of memory cells MC10 and MC20 can be arrayed in a direction D2 in which the bit lines BL1 and BL2 extend. Furthermore, many pairs of memory cells MC10 and MC20 can be arrayed in the direction D1 in which the word lines WL and WWL extend. Each pair of memory cells MC10 and MC20 arrayed in the D2 direction share the read bit line RBL. Each pair of memory cells MC10 and MC20 arrayed in the D1 direction share the word lines WL and WWL.

Operations performed by the MRAM according to the fifth embodiment are described next.

(Write Operation)

Figure 15A:
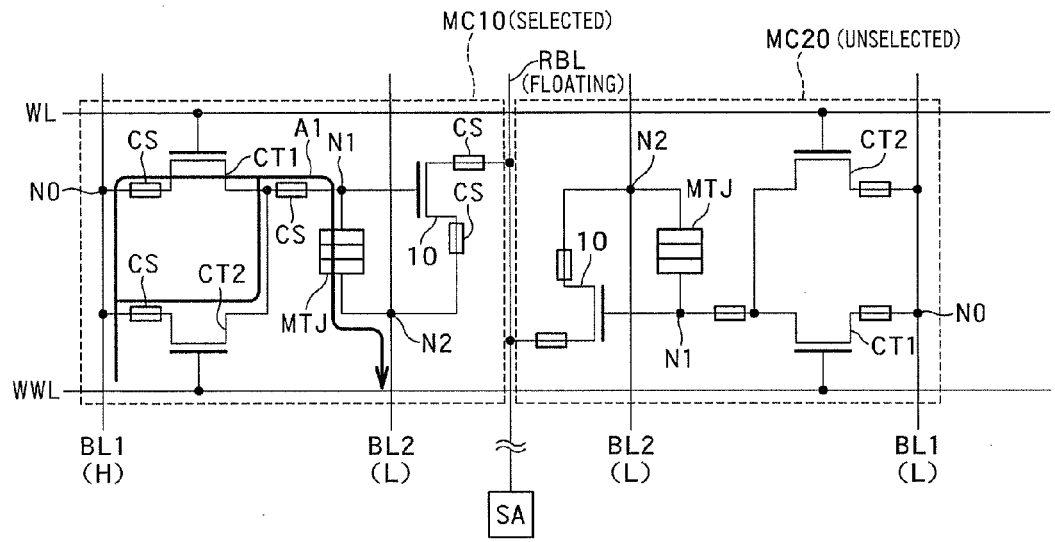
FIGS. 15A and 15B are explanatory diagrams showing a data write operation performed by the MRAM according to the fifth embodiment.
Figure 15B:
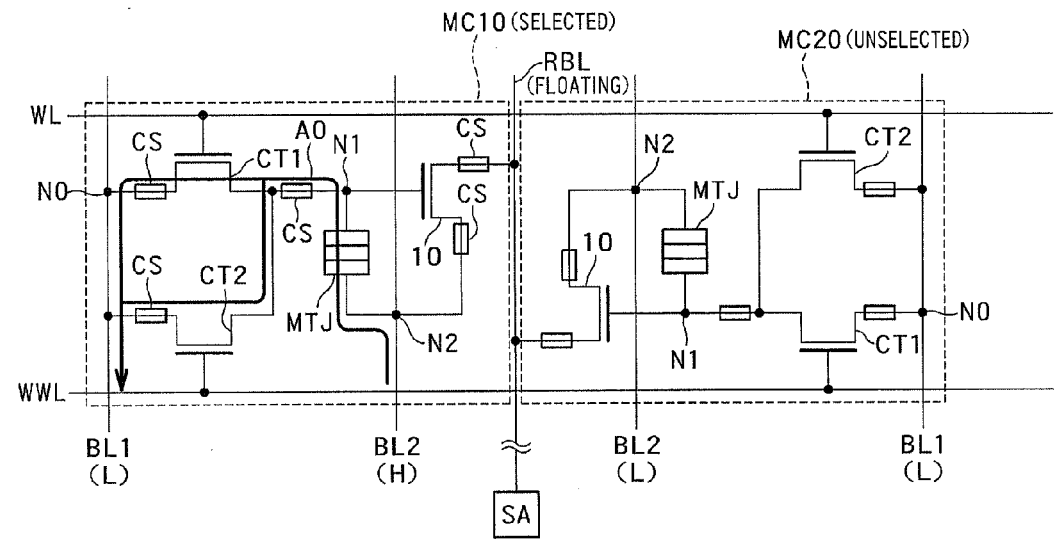
Figure 17:
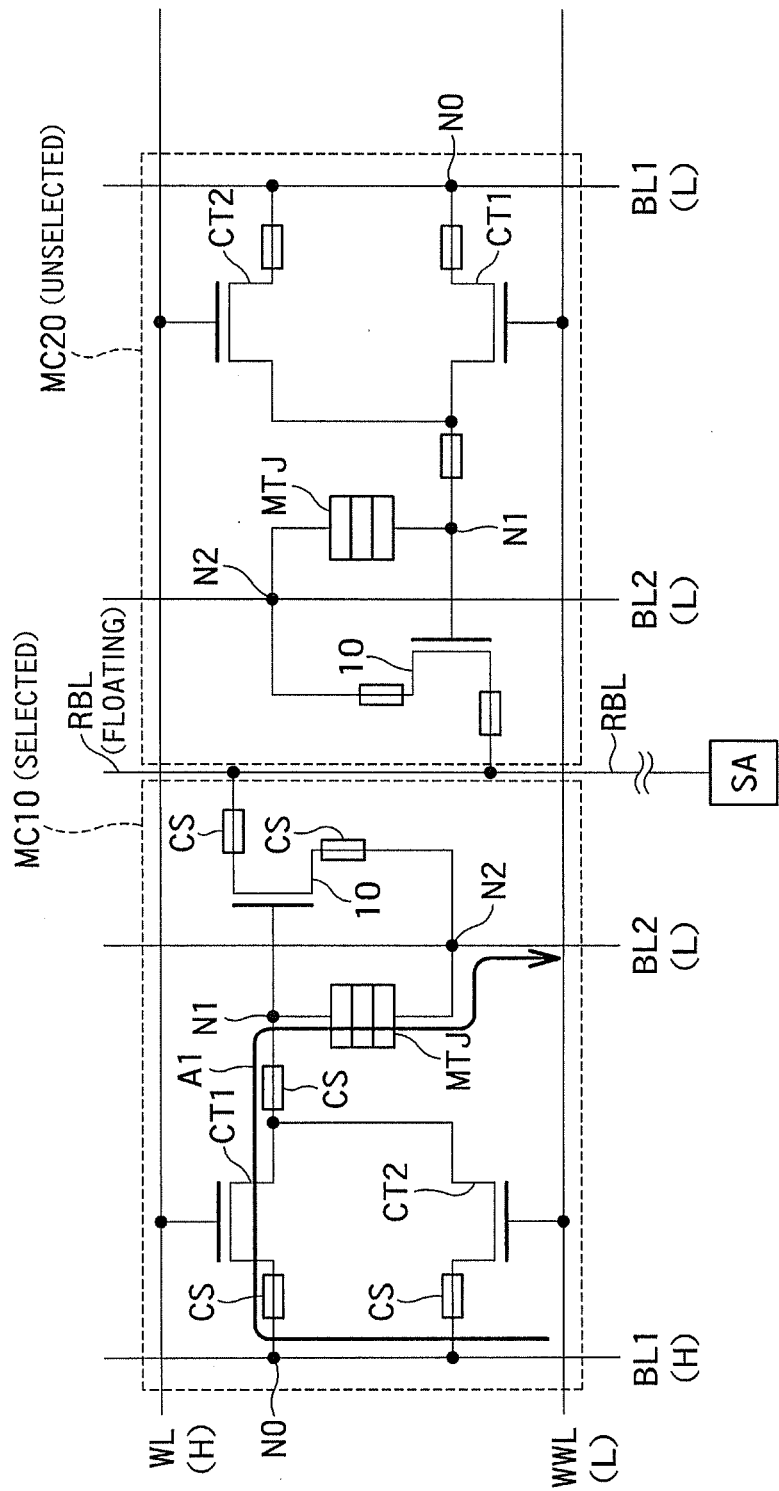
FIG. 17 is an explanatory diagram showing a data read operation performed by the MRAM according to the fifth embodiment.

FIGS. 15A and 15B are explanatory diagrams showing a data write operation (hereinafter, also simply "write operation") performed by the MRAM according to the fifth embodiment. FIG. 15A shows a voltage and a current flow of each wiring at the time of writing the data "1". FIG. 15B shows a voltage and a current flow of each wiring at the time of writing the data "0". It is assumed here that the memory cell MC10 is a selected memory cell and that the memory cell MC20 is an unselected memory cell. In FIGS. 15A, 15B, and 17, the contact plugs are simply denoted by CS.

As shown in FIG. 15A, at the time of writing the data "1", the voltages of the bit lines BL1 and BL2 of the selected memory cell MC10 are set to a high level voltage H and a low level voltage L, respectively. Furthermore, during the write operation, a relatively high cell current Icell is necessary. Therefore, both the word lines WL and WWL are driven and both the cell transistors CT1 and CT2 are turned on. The entire channel width of the cell transistors CT1 and CT2 is thereby larger than that during a read operation. Therefore, the cell current Icell higher than the cell current Icell during the read operation flows from the bit line BL1 to the MTJ element via the cell transistors CT1 and CT2 and flows into the bit line BL2. That is, the cell current Icell higher than the cell current Icell during the read operation flows in the arrow A1 direction. As a result, the MTJ element becomes the high resistance state and the data "1" is written to the memory cell MC10.

At this time, the read bit line RBL is in the electrically floating state. Therefore, the voltage of the read bit line RBL is almost identical to that of the bit line BL2 by capacitive coupling with the bit line BL2 and the sense transistor 10 does not operate. Furthermore, both the bit lines BL1 and BL2 of the unselected memory cell MC20 are kept to the low level voltage L. Therefore, although the word lines WL and WWL are driven and the cell transistors CT1 and CT2 of the memory cell MC20 are turned on, the cell current Icell hardly flows between the bit lines BL1 and BL2. As a result, no data is written to the unselected memory cell MC20.

As shown in FIG. 15B, at the time of writing the data "0", the voltages of the bit lines BL1 and BL2 of the selected memory cell MC10 are set to the low level voltage L and the high level voltage H, respectively. Furthermore, during the write operation, the relatively high cell current Icell is necessary. Therefore, both the word lines WL and WWL are driven and both the cell transistors CT1 and CT2 are turned on. The entire channel width of the cell transistors CT1 and CT2 is thereby larger than that during the read operation. Therefore, the cell current Icell higher than the cell current Icell during the read operation flows from the bit line BL2 to the MTJ element and flows into the bit line BL1 via the cell transistors CT1 and CT2. That is, the cell current Icell higher than the cell current Icell during the read operation flows in the arrow A2 direction opposite to the arrow A1 direction. As a result, the MTJ element becomes the low resistance state and the data "0" is written to the memory cell MC10.

At this time, the read bit line RBL is in the electrically floating state similarly to the time of writing the data "1". Therefore, the voltage of the read bit line RBL is almost identical to that of the bit line BL2 similarly to the time of the writing the data "1" and the sense transistor 10 does not operate. Furthermore, both the bit lines BL1 and BL2 of the unselected memory cell MC20 are kept to the low level voltage L similarly to the time of the writing the data "1". Therefore, no data is written to the unselected memory cell MC20.

Figure 16:
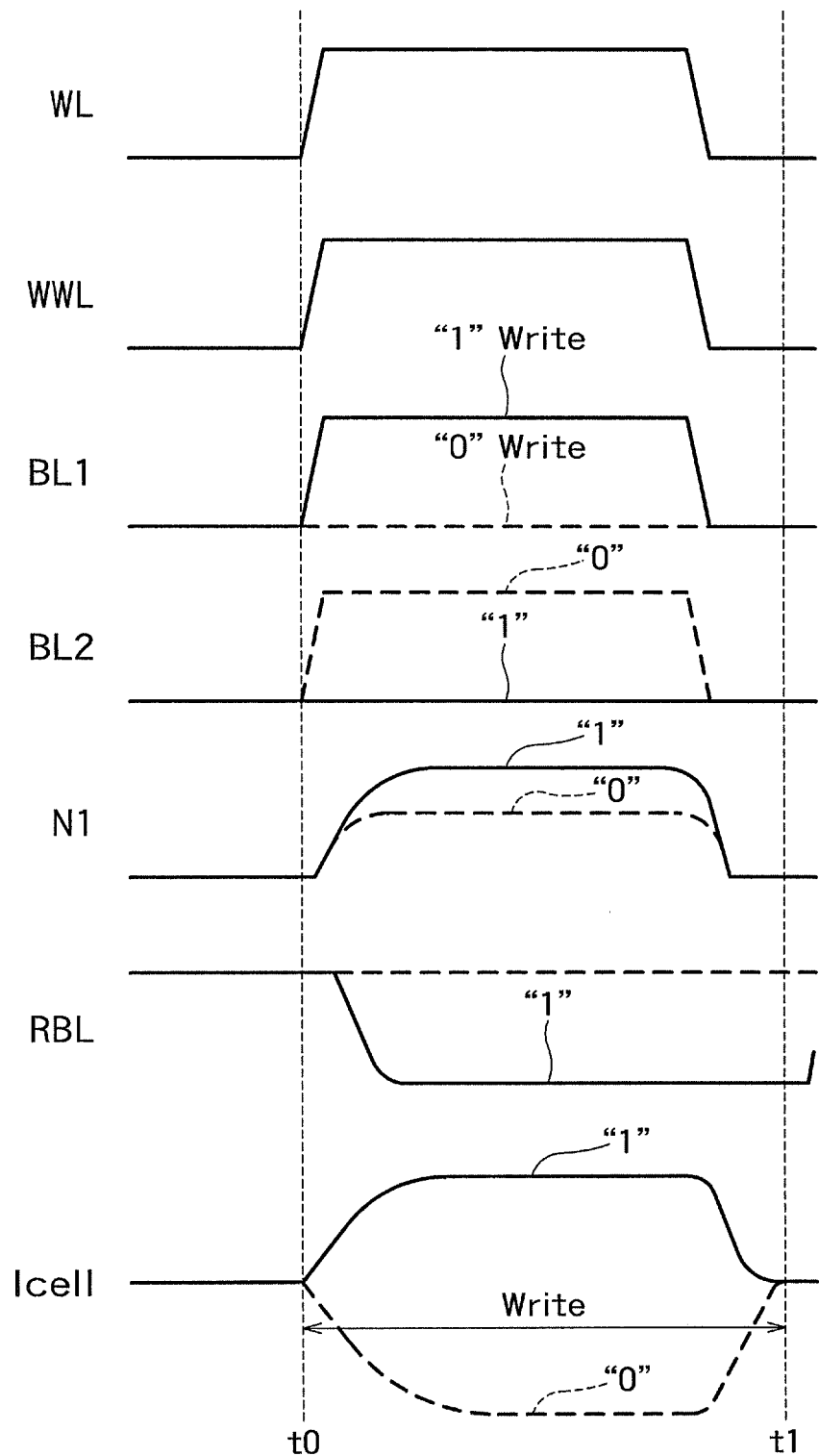
FIG. 16 is a timing chart showing a write operation performed by the MRAM according to the fifth embodiment.

FIG. 16 is a timing chart showing a write operation performed by the MRAM according to the fifth embodiment. For example, in a period from a time t0 to the time t1, the voltages of the word lines WL and WWL are raised to a high level voltage. Furthermore, a voltage dependent on the write data is applied to the bit lines BL1 and BL2.

At the time of writing the data "1", the cell current Icell passes through the two contact plugs CS and then flows to the MTJ element, as shown in FIG. 15A. On the other hand, at the time of writing the data "0", the cell current Icell flows to the MTJ element and then passes through the two contact plugs CS, as shown in FIG. 15B. Therefore, the voltage of the sense node N1 is the voltage obtained by the resistance division using the MTJ element and the two contact plugs CS as shown in FIG. 16.

The voltage of the read bit line RBL is almost identical to that of the bit line BL2 because the read bit line RBL is in the floating state as described above.

The arrow A1 direction in which the cell current Icell flows at the time of writing the data "1" is opposite to the arrow A2 direction in which the cell current Icell flows at the time of writing the data "0". Therefore, the cell current Icell is a positive current at the time of writing the data "1" whereas the cell current Icell is a negative current at the time of writing the data "0". Definitions of the data "1" and the data "0" can be exchanged. In this case, a voltage relation between the bit lines BL1 and BL2 and a relation between the positive cell current Icell and the negative cell current Icell are naturally opposite to those described above.

(Read Operation)

FIG. 17 is an explanatory diagram showing a data read operation (hereinafter, also simply "read operation") performed by the MRAM according to the fifth embodiment. FIG. 17 shows a voltage and a current flow of each wiring at the time of reading data. It is assumed here that the memory cell MC10 is the selected memory cell and that the memory cell MC20 is the unselected memory cell. Furthermore, at the time of reading the data, the read bit line RBL is precharged with the high level voltage H in advance.

As shown in FIG. 17, in the data read operation, the voltages of the bit lines BL1 and BL2 of the selected memory cell MC10 are set to the high level voltage H and the low level voltage L, respectively. Furthermore, during the read operation, the cell current Icell is set lower than that during the write operation so as not to destruct the data. Therefore, the word line WL is driven but the word line WWL is not driven. The cell transistor CT1 is thereby turned on but the cell transistor CT2 is thereby turned off. The entire channel width of the cell transistors CT1 and CT2 is thereby smaller than that during the write operation. Therefore, the cell current Icell lower than the cell current Icell during the write operation flows from the bit line BL1 to the MTJ element via the cell transistor CT1 and flows into the bit line BL2. That is, the cell current Icell lower than the cell current Icell during the write operation flows in the arrow A1 direction.

At this time, magnitudes of the cell current Icell and the voltage of the sense node N1 depend on the resistance state (the logic of the data) of the MTJ element. For example, when the memory cell MC10 stores the data "1", the MTJ element is in the high resistance state, so that the cell current Icell is relatively low. Therefore, the voltage of the sense node N1 is higher than that of the sense node N1 at the time of reading the data "0". On the other hand, when the memory cell MC10 stores the data "0", the MTJ element is in the low resistance state, so that the cell current Icell is relatively high. Therefore, the voltage of the sense node N1 is lower than that of the sense node N1 at the time of reading the data "1". A conduction state of the sense transistor 10 changes depending on such a difference in the voltage of the sense node N1. For example, the sense transistor 10 is turned on when the voltage of the sense node N1 is relatively high, and turned off when the voltage of the sense node N1 is relatively low.

When the sense transistor 10 is turned on, the bit line BL2 is connected to the read bit line RBL. Electric charge of the read bit line RBL precharged in advance is thereby emitted to the bit line BL2 via the sense transistor 10. As a result, the voltage of the read bit line RBL lowers. On the other hand, when the sense transistor 10 is kept to be turned off, the bit line BL2 is kept disconnected from the read bit line RBL. Therefore, the read bit line RBL is kept precharged and the voltage of the read bit line RBL is kept to the high level voltage.

The sense amplifier SA detects the voltage difference on the read bit line RBL. The sense amplifier SA thereby reads the data stored in the memory cell MC10.

Figure 18:
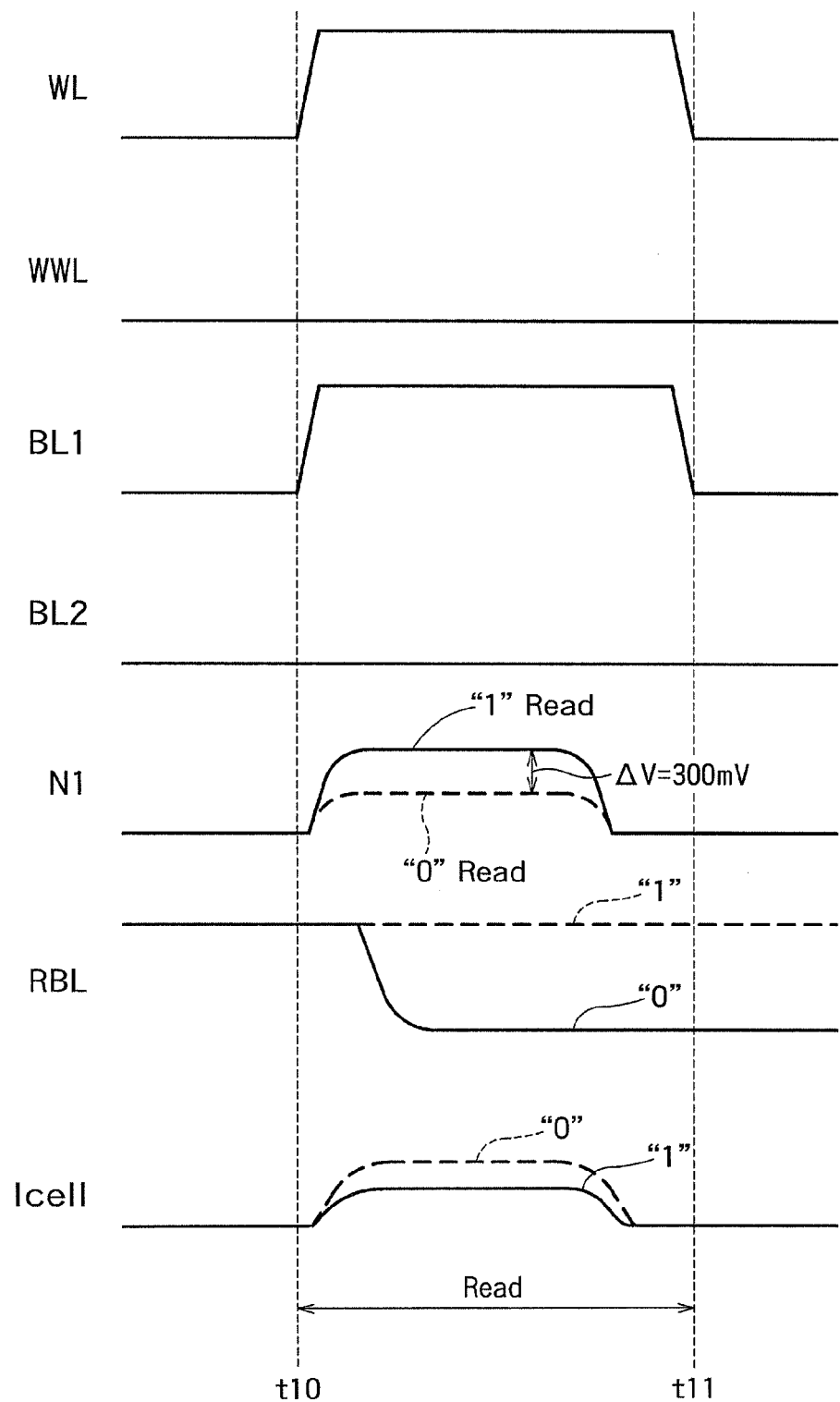
FIG. 18 is a timing chart showing an example of a write operation performed by the MRAM according to the fifth embodiment.

FIG. 18 is a timing chart showing an example of a write operation performed by the MRAM according to the fifth embodiment. For example, in a period from a time t10 to the time t11, the voltage of the word line WL is raised to the high level voltage. The voltage of the word line WWL is kept to the low level voltage. Furthermore, the voltage of the bit line BL1 is raised to the high level voltage and that of the bit line BL2 is kept to the low level voltage.

When the memory cell MC10 stores the data "1", the voltage of the sense node N1 is higher than the threshold voltage Vth of the sense transistor 10. Therefore, the sense transistor 10 is turned on and the voltage of the read bit line RBL lowers to the low level voltage. On the other hand, when the memory cell MC10 stores the data "0", the voltage of the sense node N1 is lower than the threshold voltage Vth of the sense transistor 10. Therefore, the sense transistor 10 is kept to be turned off and the voltage of the read bit line RBL is kept to the high level voltage.

The MTJ element is in the high resistance state in a case of the data "1" and in the low resistance state in a case of the data "0". Therefore, the cell current Icell at the time of writing the data "1" is lower than that at the time of writing the data "0".

As described above, the MRAM according to the fifth embodiment can greatly change the voltage of the read bit line RBL, depending on the voltage of the sense node N1. That is, the voltage of the sense node N1 can fully swing. The MRAM according to the fifth embodiment can adopt the voltage-detection sense amplifier as the sense amplifier SA and can achieve effects identical to those of the MRAM according to the first embodiment.

Furthermore, according to the fifth embodiment, the two word lines WL and WWL are provided for each memory cell MC and the two cell transistors CT1 and CT2 are also provided for each memory cell MC. During the data write operation, both of the word lines WL and WWL are driven and both of the cell transistors CT1 and CT2 connected in parallel are turned on. The entire channel width of the cell transistors CT1 and CT2 can be thereby made large, so that the cell current Icell during the write operation can be set high. This can ensure writing the data to the memory cell MC and reducing the write time. On the other hand, during the data read operation, the word line WL is driven but the word line WWL is not driven. The cell transistor CT1 is thereby turned on and the cell transistor CT2 is thereby kept to be turned off. It is thereby possible to narrow (to shrink) the entire channel width of the cell transistors CT1 and CT2 and suppress data destruction during the read operation.

A channel width of the cell transistor CT1 can be set equal to that of the cell transistor CT2. In this case, during the read operation, there is no need to distinguish the word line WL from the word line WWL. Therefore, whichever is selected, the memory cell MC10 or MC20 during the data read operation, there is no need to change the word lines WL to WWL to be driven. Alternatively, the channel width of the cell transistor CT1 can be set different from that of the cell transistor CT2. In this case, it is necessary to distinguish the word lines WL and WWL and switch the word line WL to the word line WWL or vice versa, depending on the read operation for reading the data from the memory cell MC10 or on the reading operation for reading the data from the memory cell MC20. This is because a positional relation between the memory cells MC10 and MC20 is that a position of one corresponds to a position obtained by rotating (inverting) the other by 180 degrees about an axis in the D1 direction. For example, when the word line WL is set to be driven and the word line WWL is set not to be driven at the time of reading the data from the memory MC10, it is necessary to drive the word line WWL and not to drive the word line WL at the time of reading the data from the memory MC20.

According to the fifth embodiment, the memory cells MC10 and MC20 sharing the word lines WL and WWL and adjacent to each other share the read bit line RBL. Therefore, according to the fifth embodiment, a layout area of the memory cells MC can be made small.

(Layout of Memory Cell MC)

Figure 19A:
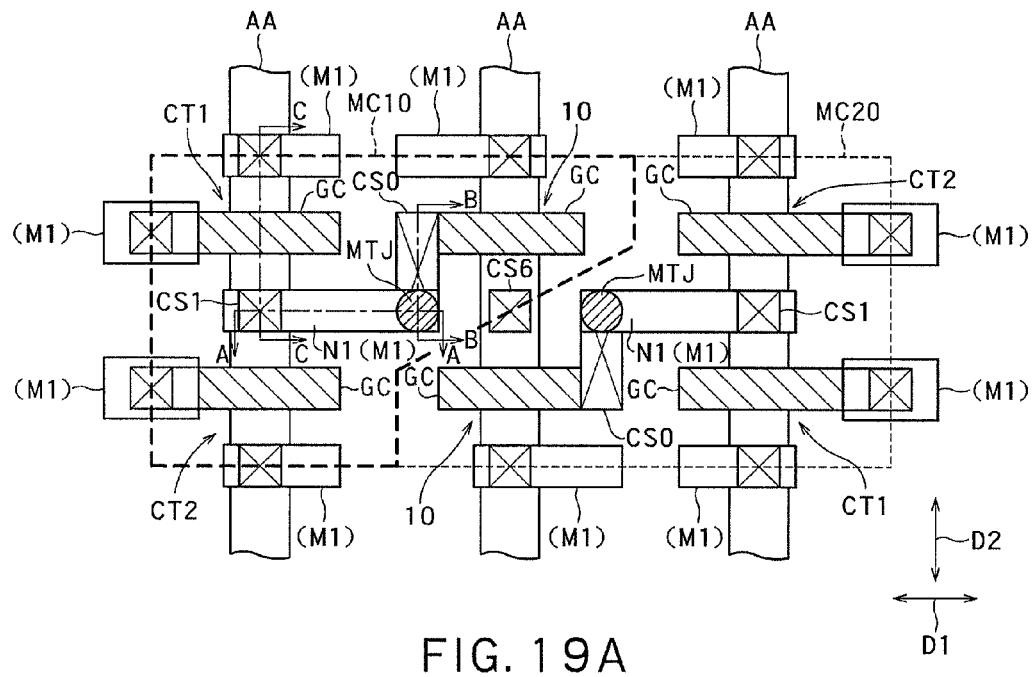
FIGS. 19A and 19B are plan views showing an example of layouts of the MRAM according to the fifth embodiment.
Figure 19B:
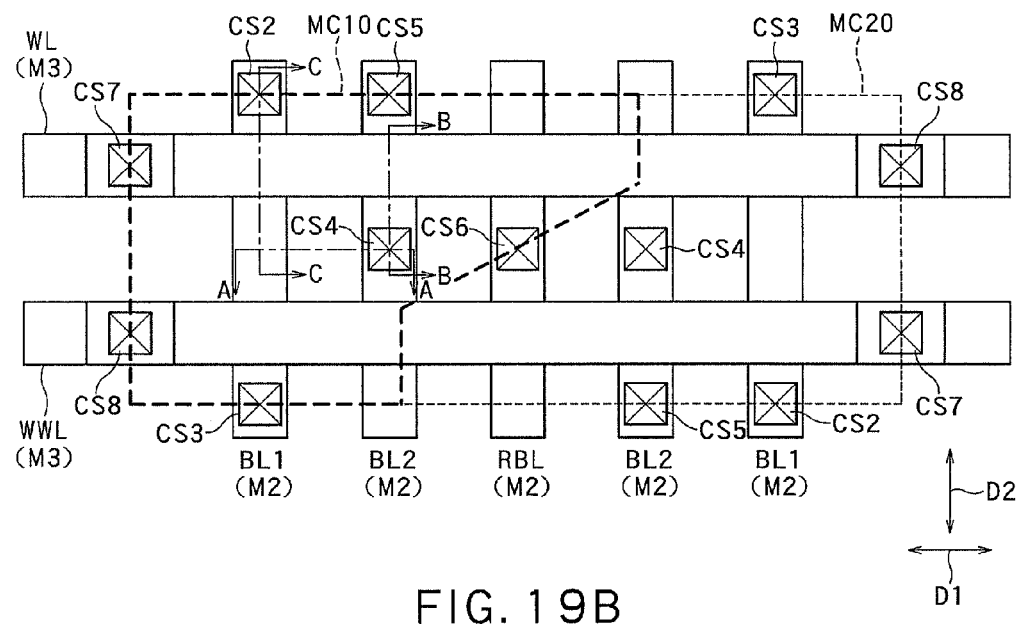
Figures 20A, 20B, 20C:
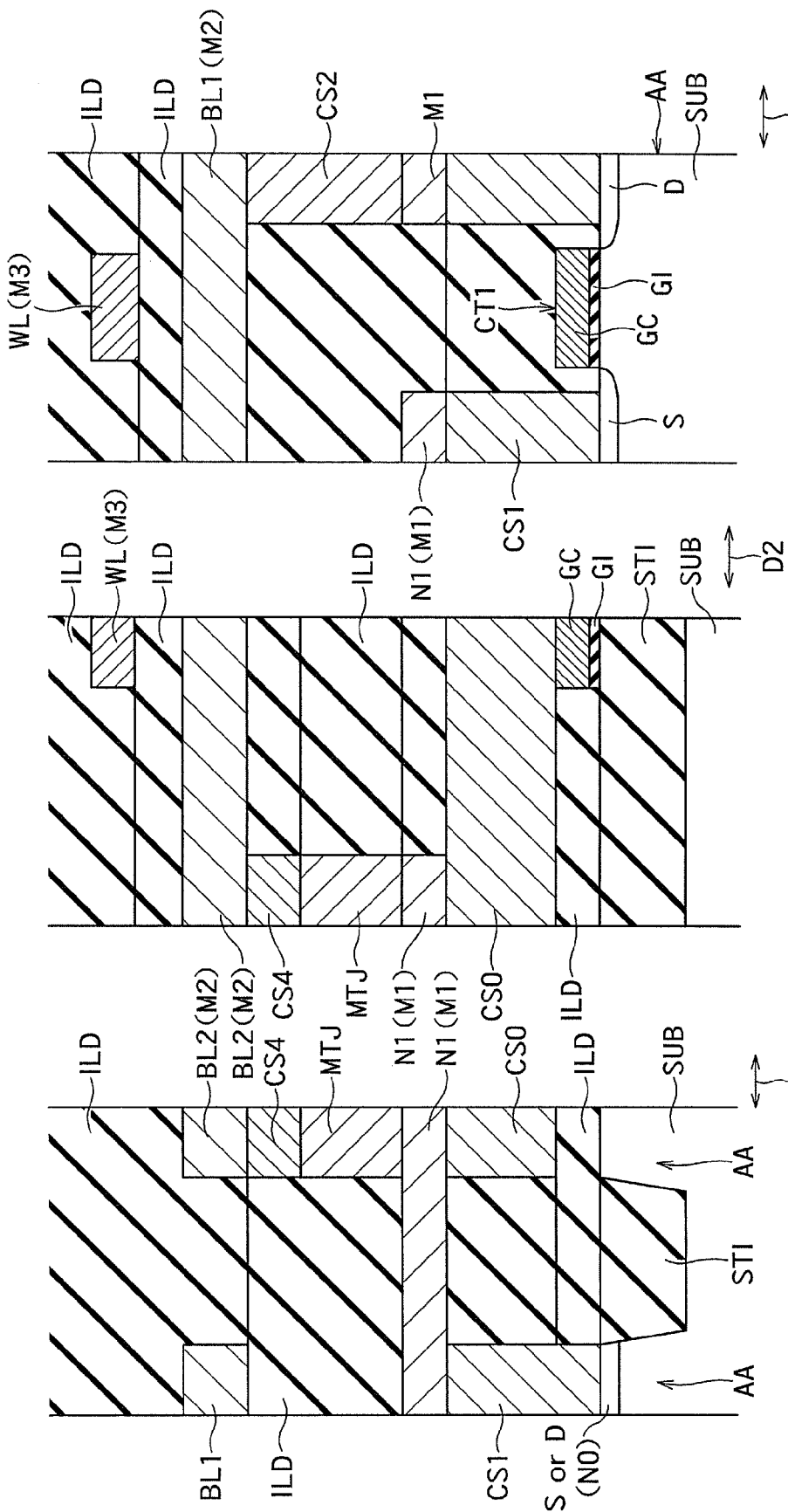
FIGS. 20A to 20C are cross-sectional views taken along lines A-A, B-B, and C-C, respectively shown in FIGS. 19A and 19B.

FIGS. 19A and 19B are plan views showing an example of layouts of the MRAM according to the fifth embodiment. FIG. 19A shows a layout of a lower layer than a second metal layer M2 that forms the bit lines BL1 and BL2 and the read bit line RBL. FIG. 19B shows a layout of the second metal layer M2 and an upper layer than the second metal layer M2. FIGS. 20A to 20C are cross-sectional views taken along lines A-A, B-B, and C-C, respectively shown in FIGS. 19A and 19B.

As shown in FIGS. 19A, 20A, and 20C, the active areas AA are formed on a surface of a semiconductor substrate SUB. As shown in FIGS. 19A and 19B, the active areas AA are formed to extend in the extending direction D2 of the bit lines BL1 and BL2 and the read bit lines RBL. The active areas AA are provided below the bit lines BL1 and BL2 and the read bit line RBL so as to overlap with the bit lines BL1 and BL2 and the read bit line RBL. As shown in FIG. 20A, an element isolation STI is provided between the active areas AA adjacent to each other in the D1 direction.

Source layers S and drain layers D of the cell transistors CT1 and CT2 and the sense transistor 10 are formed in the active areas AA. For example, FIG. 20C shows a cross-section of the cell transistor CT1. A part of the active area AA between a source layer S and the drain layer D serves as a channel region. A gate dielectric film GI is provided on the channel region of the active area AA, and a gate electrode GC is provided on the gate dielectric film GI. For example, the gate electrode GC is made of a conductive material such as doped polysilicon. For example, the drain layer D is connected to the bit line BL1 via the contact plug CS2. The source layer S is connected to the sense node N1 via the contact plug CS1. The bit line BL1 extends in the D2 direction and the word line WL extends in the D1 direction above the bit line BL1.

As shown in FIGS. 20A and 20B, the sense node N1 is formed using the first metal layer M1. One end of the sense node N1 is connected to a contact plug CS0 as shown in FIG. 20A, and also connected to the gate electrode GC of the sense transistor 10 via the contact plug CS0 as shown in FIG. 20B. The other end of the sense node N1 is connected to the node N0 present between the cell transistors CT1 and CT2 via the contact plug CS1, as shown in FIG. 20A. That is, the other end of the sense node N1 is connected to the source layer S (or the drain layer D) common to the cell transistors CT1 and CT2.

As shown in FIG. 20A, the MTJ element is formed on one end of the sense node N1. One end (the lower end) of the MTJ element is thereby electrically connected to the sense node N1.

As shown in FIGS. 20A and 20B, the bit line BL2 is provided on the MTJ element. The bit line BL2 is connected to the other end (the upper end) of the MTJ element via the contact plug CS4. As shown in FIG. 19B, the bit lines BL1 and BL2 and the read bit line RBL are formed using the second metal layer M2 and extend in the D2 direction. The bit line BL1 is connected to the drain layer D of the cell transistor CT1 via the contact plug CS2 as described with reference to FIG. 20C. Although a cross-section is not shown, the bit line BL1 is similarly connected to the drain layer D of the cell transistor CT2 via the contact plug CS3 (see FIG. 19B). As shown in FIG. 20B, the bit line BL2 is connected to the other end of the MTJ element via the contact plug CS4. Although a cross-section is not shown, the bit line BL2 is connected to the diffusion layer (the source layer S, for example) of the sense transistor 10 via the contact plug CS5 (see FIG. 19B). That is, the bit line BL2 is connected to the node N2 via the contact plugs CS4 and CS5. The read bit line RBL is connected to the other diffusion layer (the drain layer D, for example) of the sense transistor 10 via a contact plug CS6.

As shown in FIGS. 20B and 20C, the word lines WL and WWL are provided on the bit lines BL1 and BL2 and the read bit line RBL via an interlayer dielectric film ILD. As shown in FIG. 19B, the word lines WL and WWL are formed using the third metal layer M3 and extend in the D1 direction. The word line WL is connected to the gate electrode GC of the cell transistor CT1 via a contact plug CS7. The word line WWL is connected to the gate electrode GC of the cell transistor CT2 via a contact plug CS8.

As described above, according to the fifth embodiment, the sense transistor 10 and the cell transistors CT1 and CT2 are formed on the surface of the semiconductor substrate SUB. The sense node N1 is formed using the first metal layer M1 on the contact plug CS0 provided on the gate electrode GC of the sense transistor 10. The sense node N1 is connected to the gate electrode GC of the sense transistor 10 via the contact plug CS0. The MTJ element is provided on the sense node N1. The bit lines BL1 and BL2 and the read bit line RBL are formed using the second metal layer M2 provided on the MTJ element. Furthermore, the word lines WL and WWL are formed using the third metal layer M3 provided above the second metal layer M2.

As shown in FIG. 19A, the memory cells MC10 and MC20 sharing the read bit line RBL are rotationally symmetric about the contact plug CS6 that connects the read bit line RBL to the sense transistor 10. Therefore, when a layout of one of the memory cells MC10 and MC20 is rotated by 180 degrees, the layout overlaps with the other layout. The memory cells MC10 and MC20 thereby constitute a rectangular pair of memory cells MC10 and MC20.

Among the sense transistor 10 and the cell transistors CT1 and CT2, the sense transistor 10 is the closest to a center (the contact plug CS6) of the memory cells MC10 and MC20. On the other hand, the cell transistors CT1 and CT2 are relatively away from the center of the memory cells MC10 and MC20. That is, the sense transistor 10 is arranged close to the read bit line RBL, as compared with the cell transistors CT1 and CT2. In other words, the sense transistor 10 is arranged in a central portion of a rectangle constituted by the memory cells MC10 and MC20, and the cell transistors CT1 and CT2 are away from the central portion of the rectangle as compared with the sense transistor 10.

The MTJ element is arranged among the sense transistor 10 and the cell transistors CT1 and CT2. That is, the MTJ element is arranged between the read bit line RBL and the bit line BL1 (below the bit line BL2). Furthermore, the MTJ element is provided between the sense node N1 (the first metal layer M1) and the bit line BL2 (the second metal layer M2). Therefore, the bit lines BL1 and BL2 and the read bit line RBL extending in the D2 direction are formed using the second metal layer M2. The word lines WL and WWL extending in the D1 direction are formed using the third metal layer M3 that is the upper layer than the second metal layer M2. The bit lines BL1 and BL2 are formed above the read bit line RBL.

Furthermore, as shown in FIG. 19B, the two bit lines BL2 corresponding to the memory cells MC10 and MC20 are provided on both sides of the read bit line RBL, respectively, about the read bit line RBL, and the two bit lines BL1 are further provided outside of the two bit lines BL2, respectively. Therefore, the bit lines BL1 and BL2 and the read bit line RBL are arranged in an order of BL1, BL2, RBL, BL2, BL1 and so on along the D1 direction. The read bit line RBL is drawn out of the central portion of the rectangle constituted by the memory cells MC10 and MC20. By adopting such a layout, the layout area of the memory cells MC10 can be made as compact as about 50 $F^2$. Because a layout area of a conventional SRAM is about 100 $F^2$, the layout area of the MRAM according to the fifth embodiment is about half of that of the conventional SRAM.

The MRAM according to the fifth embodiment uses a voltage sensing method. Therefore, an operating rate of the MRAM can be set equal to or lower than about 3 ns. This is comparable to an operating rate of the conventional SRAM. Therefore, the MRAM according to the fifth embodiment is advantageous over the SRAM in the nonvolatile memory, non-destruction of the data during the read operation, the layout area, and the operating rate. Therefore, the MRAM according to the fifth embodiment can be used as a cache memory in place of the SRAM.

In FIG. 14, the short circuit SC is not shown. However, the MRAM according to the fifth embodiment can further include the short circuit SC. In the fifth embodiment, the short circuit SC can be connected between the bit line BL1 and the read bit line RBL as shown in FIG. 10. Furthermore, in the fifth embodiment, the source of the sense transistor 10 can be connected to the ground voltage Vss.

In the fifth embodiment, the MRAM can further include the switching transistor 11 connected between the sense transistor 10 and the read bit line RBL for each memory cell MC as shown in FIG. 12. In this case, the gate of the switching transistor 11 is connected to the word line WL or WWL driven during the read operation. For example, in the memory cell MC10 shown in FIG. 14, the gate of the switching transistor 11 is connected to the word line WL. In the memory cell MC20 shown in FIG. 14, the gate of the switching transistor 11 is connected to the word line WWL.

(Third Modification)

Figure 21:
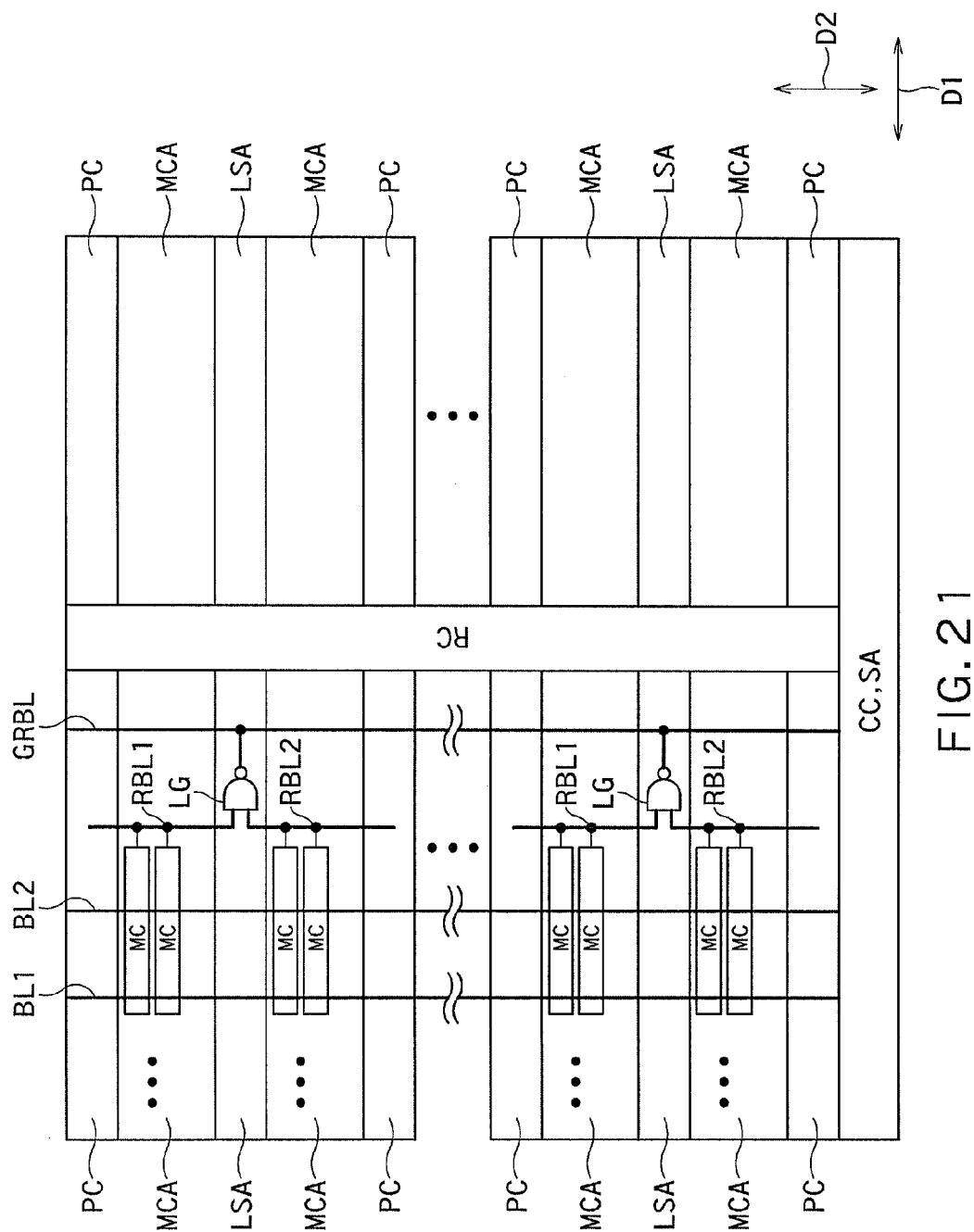
FIG. 21 is a schematic diagram showing an example of a configuration of an MRAM according to a third modification of the first embodiment.

FIG. 21 is a schematic diagram showing an example of a configuration of an MRAM according to a third modification of the above embodiments. The MRAM according to the third modification further includes logic gates LG and global read bit lines GRBL. Each read bit line RBL extending in the D2 direction is divided into a plurality of read bit lines, that is, a first read bit line RBL1 and a second read bit line RBL2 (hereinafter, also simply "read bit lines RBL1 and RBL2"). Among the divided read bit lines RBL, the first read bit line RBL1 and the second read bit line RBL2 are provided to correspond to the two memory cell arrays MCA that are adjacent in the D2 direction and connected to the memory cells MC in the corresponding memory cell arrays MCA, respectively. The first and second read bit lines RBL1 and RBL2 are connected to two inputs of one logic gate LG, respectively. An output of the logic gate LG is connected to one global read bit line GRBL. For example, the logic gate LG is a NAND gate and provided to correspond to each pair of read bit lines RBL1 and RBL2 arrayed in the D2 direction. The global read bit line GRBL is shared among a plurality of logic gates LG arrayed in the D2 direction. The sense amplifier SA is connected to the global read bit line GRBL.

Precharge circuits PC and local sense amplifiers LSA are alternately provided between the memory cell arrays MCA that are adjacent in the D2 direction. That is, the precharge circuits PC, the local sense amplifiers LSA, and the memory cell arrays MCA are arrayed in such an order as PC, MCA, LSA, MCA, PC, MCA, LSA, MCA and so on. The logic gates LG are provided in regions of the local sense amplifiers LSA, respectively. Reference character CC denotes the column controller and reference character RC denotes the row controller RC (see FIG. 1).

In FIG. 21, only a set of the bit lines BL1 and BL2, the read bit lines RBL1 and RBL2, and the global bit line GRBL are shown to correspond to the memory cells MC in one column arrayed in the D2 direction for the sake of convenience. However, when a plurality of memory cells MC (or a plurality of pairs of memory cells MC) are arrayed within each memory cell array MCA in the D1 direction, a plurality of sets of the bit lines BL1 and BL2, the read bit lines RBL1 and RBL2, and the global read bit line GRBL are arrayed in the D1 direction, accordingly.

Other configurations of the third modification can be identical to corresponding ones of the first to fifth embodiments described above.

The read bit lines RBL1 and RBL2 divided from one read bit line RBL are connected to one global read bit line GRBL via one logic gate LG. Therefore, the data stored in the selected memory cell MC among the memory cells MC sharing the bit lines BL1 and BL2 is transmitted to the global read bit line GRBL via the read bit line RBL1 (or RBL2) and the logic gate LG. For example, when the read bit line RBL1 and RBL2 are precharged with the high level voltage, the logic gate LG outputs logical low during precharging. When the data "1" is stored in the selected memory cell MC among the memory cells MC connected to the read bit lines RBL1 and RBL2, the corresponding logic gate LG transmits logical high to the global read bit line GRBL. On the other hand, when the data "0" is stored in the selected memory cell MC, the corresponding logic gate LG transmits logical low to the global read bit line GRBL. The sense amplifier SA detects the logic of the data stored in the selected memory cell MC by detecting a voltage of the global read bit line GRBL.

As described above, according to the third modification, the read bit line RBL is divided into the read bit lines RBL1 and RBL2 in the D2 direction, and each of the read bit lines RBL1 and RBL2 is shared among the memory cells MC. Each logic gate LG selectively outputs the data stored in one of the memory cells MC sharing the corresponding paired read bit lines RBL1 and RBL2. At this time, the logic gate LG also functions as a buffer. The logic gate LG can thereby transmit the voltage difference between the read bit lines RBL1 and RBL2 to the global read bit line GRBL and the sense amplifier SA either without attenuating the voltage difference or while increasing the voltage difference. That is, the voltage difference of the global read bit line GRBL can fully swing.

The MRAM according to the first embodiment is a single-end memory for storing one-bit data in one memory cell MC. Because the signal difference between the read data is relatively small in the single-end memory, it is necessary to set the number of memory cells MC sharing one read bit line RBL to be relatively small. For example, it is preferable to set the number of memory cells MC sharing one read bit line RBL to be equal to or smaller than 64. Therefore, by dividing each read bit line RBL into a plurality of read bit lines as described in the third modification as the read bit lines RBL1 and RBL2, it is possible to keep down the number of memory cells MC connected to each read bit line RBL. In this way, according to the third modification, it is possible to suppress a reduction in the signal difference of the read bit line RBL during the read operation.

Furthermore, it is possible to accelerate data transmission by connecting each logic gate LG between the read bit line RBL1 or RBL2 and the global read bit line GRBL.

The third modification can be applied to any of the first to fifth embodiments. Accordingly, the third modification can achieve effects identical to any one of those of the first to fifth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
an MTJ element and a first cell transistor connected in series between a first bit line and a second bit line;
a sense transistor having a gate connected to a sense node which is provided between the first cell transistor and the MTJ element; and
a read bit line connected to a source or a drain of the sense transistor, the read bit line being configured to transmit a logic of data of the MTJ element,
wherein:
the sense node is formed using a first metal layer on a contact plug provided on a gate electrode of the sense transistor, and is connected to the gate electrode via the contact plug,
the MTJ element is provided on the sense node, and
the first bit line, the second bit line, and the read bit line are formed using a second metal layer provided on the MTJ element.

2. The device of claim 1, further comprising a word line formed using a third metal layer provided above the first bit line and the second bit line.

3. The device of claim 2, wherein:
the first bit line, the second bit line, and the read bit line extend in a perpendicular direction to an extending direction of the word line, and
a plurality of pairs of the first bit line and the second bit line adjacent to each other in the extending direction of the word line share the read bit line.

4. The device of claim 3, wherein when the first bit line, the second bit line, and the read bit line are denoted as BL1, BL2, and RBL, respectively, BL1, BL2, and RBL are arranged in an order of BL1, BL2, RBL, BL2, and BL1.

5. The device of claim 2, wherein:
the MTJ element, the first cell transistor, and the sense transistor form one memory cell, and
two memory cells adjacent to each other in an extending direction of the word line share the read bit line.

6. The device of claim 5, wherein the sense transistor is arranged nearer the read bit line as compared with the first cell transistor in the memory cell.

* * * * *